United States Patent
Sherman

(10) Patent No.: US 8,057,248 B1
(45) Date of Patent: Nov. 15, 2011

(54) CONNECTOR FOR MOUNTING TO A CIRCUIT BOARD

(76) Inventor: Neil S. Sherman, San Bruno, CA (US)

( * ) Notice: Subject to any disclaimer, the term of this patent is extended or adjusted under 35 U.S.C. 154(b) by 0 days.

(21) Appl. No.: 12/979,687

(22) Filed: Dec. 28, 2010

Related U.S. Application Data

(63) Continuation-in-part of application No. 12/424,341, filed on Apr. 15, 2009, now Pat. No. 7,878,834.

(60) Provisional application No. 61/124,459, filed on Apr. 17, 2008.

(51) Int. Cl.
*H01R 13/62* (2006.01)

(52) U.S. Cl. .................... 439/324; 439/567; 439/700

(58) Field of Classification Search .................. 439/324, 439/567, 700, 79–82; 324/761
See application file for complete search history.

(56) References Cited

U.S. PATENT DOCUMENTS

| | | | |
|---|---|---|---|
| 2,533,483 A | 12/1950 | Losquadro |
| 2,692,979 A | 10/1954 | Withey, Jr. |
| 3,068,403 A | 12/1962 | Robinson |
| 3,116,101 A | 12/1963 | Kikta |
| 3,176,256 A | 3/1965 | Turinsky |
| 3,654,583 A | 4/1972 | Mancini |
| 3,764,729 A | 10/1973 | Kowalewski |
| 4,025,142 A | 5/1977 | Huber et al. |
| 4,209,217 A | 6/1980 | Gudaitis |
| 4,332,434 A | 6/1982 | Neidecker |
| 4,353,609 A | 10/1982 | Haas |
| 4,461,537 A | 7/1984 | Raymer, II |
| 4,470,178 A | 9/1984 | Matsui |
| 4,815,991 A | 3/1989 | Bakke |
| 4,938,703 A | 7/1990 | Nakano |
| 4,944,686 A | 7/1990 | Gertz |
| 5,011,438 A | 4/1991 | Awbrey |
| 5,122,075 A | 6/1992 | Kile |
| 5,297,948 A | 3/1994 | Sadr |
| 5,452,184 A | 9/1995 | Scholder |
| 5,508,621 A | 4/1996 | Wong |
| 5,641,291 A | 6/1997 | Sueki |
| 5,709,574 A | 1/1998 | Bianca |
| 5,733,133 A | 3/1998 | Matsumura |
| 6,079,990 A | 6/2000 | Martucci |
| 6,129,568 A | 10/2000 | Mercurio |

(Continued)

OTHER PUBLICATIONS http://www.ecnmag.com/news/feeds/2010/09/applications-medical-electronics-connectors-offer-005-inch-pitch/; Electronic Component News; Sep. 15, 2010.

(Continued)

*Primary Examiner* — Javaid Nasri
(74) *Attorney, Agent, or Firm* — Neustel Law Offices

(57) ABSTRACT

A connector for mounting to a circuit board for comprising a connector device with a body, a plurality of alignment members, and one or more contact elements, wherein the alignment members extend through a plurality of alignment holes of the printed circuit board from the first surface and past the second surface of the circuit board and wherein the contact elements engage one more contact pads on the first surface of the circuit board, and a separate retention device having a supporting element and a plurality of fixed sockets is positioned along the second surface of the printed circuit board to receive the alignment members of the connector device therein so that the circuit board is positioned between the body of the connector device and the retention device to temporarily or permanently retain the contact elements of the connector device in contact with the contact pads of the circuit board.

20 Claims, 21 Drawing Sheets

U.S. PATENT DOCUMENTS 6,142,794 A 11/2000 Amberg
6,655,969 B2 12/2003 Low
6,822,466 B1 * 11/2004 Holcombe et al. ....... 324/750.25
7,046,020 B2 5/2006 LaMeres
7,086,870 B1 8/2006 Sutcliffe
7,270,575 B2 9/2007 Krantz, Jr.

OTHER PUBLICATIONS http://pdf.eicom.ru/datasheets/mill_max_pdfs/pin_receptacles_pg.142/pin_receptacles_pg.142.pdf; Mill-Max-Manufacturing Corporation; Nov. 22, 2010.

* cited by examiner

CONNECTOR FOR MOUNTING TO A CIRCUIT BOARD

CROSS REFERENCE TO RELATED APPLICATIONS

I hereby claim benefit under Title 35, United States Code, Section 120 of United States patent application Ser. No. 12/424,341 filed Apr. 15, 2009 now U.S. Pat. No. 7,878,834 which claims benefit under Title 35, United States Code, Section 119(e) of U.S. provisional patent application Ser. No. 61/124,459 filed Apr. 17, 2008. This application is a continuation in-part of the 12/424,341 application. The 12/424,341 application is currently pending. The 12/424,341 application and the 61/124,459 application are hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to connectors and more specifically it relates to a connector for mounting to a circuit board and for removably or temporarily connecting to a circuit board while maintaining a secure connection.

2. Description of the Related Art

Any discussion of the related art throughout the specification should in no way be considered as an admission that such related art is widely known or forms part of common general knowledge in the field.

Connectors, such as electrical connectors have been in use for years and are manufactured in various different configurations. Many types of electrical connectors are designed to be soldered to a printed circuit board. Because of the small size of the connectors, soldering can often be a difficult and time consuming process. In addition, on crowded circuit boards, the ability to accurately position and hold the connector while soldering can be increasingly difficult. Another problem with soldering connectors is that the connector is secured in a relatively permanent manner and thus does not allow for easy removal of the connector.

Other types of electrical connectors are also utilized that may allow for a connection in a manner other than through soldering. However, many of these connectors are often times expensive or substantially fragile thus providing yet another inefficient manner in which to connect an electrical connector or component to a circuit board.

Because of the inherent problems with the related art, there is a need for a new and improved connector for mounting to a circuit board and for removably or temporarily connecting to a circuit board while maintaining a secure connection.

BRIEF SUMMARY OF THE INVENTION

A system for removably or temporarily connecting to a circuit board while maintaining a secure connection. The invention generally relates to a circuit board connector which includes a connector device with a body, a plurality of alignment members, and one or more contact elements, wherein the alignment members extend through a plurality of alignment holes of the printed circuit board from the first surface and past the second surface of the circuit board and wherein the contact elements engage one more contact pads on the first surface of the circuit board, and a separate retention device having a supporting element and a plurality of fixed sockets is positioned along the second surface of the printed circuit board to receive the alignment members of the connector device therein so that the circuit board is positioned between the body of the connector device and the retention device to temporarily or permanently retain the contact elements of the connector device in contact with the contact pads of the circuit board.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto. In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

Figure 1:
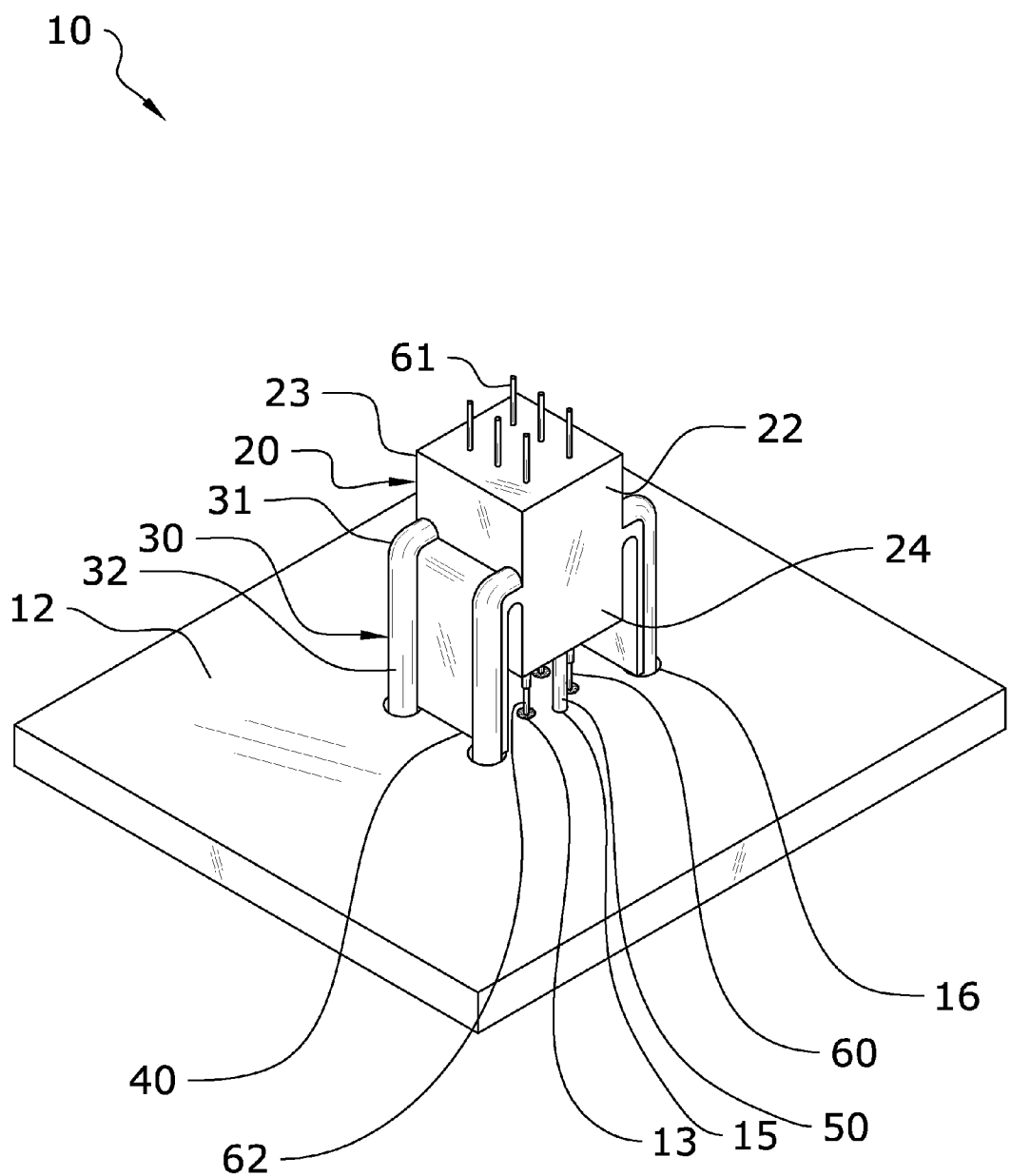
FIG. 1 is an upper perspective view of the present invention.

Turning now descriptively to the drawings, in which similar reference characters denote similar elements throughout the several views, FIGS. 1 through 17 illustrate a connector device 10, which comprises a body portion 22 separated from the secondary device 12, a plurality of legs 30 extending from the body portion 22 for removably attaching the body portion 22 to the secondary device 12, wherein the plurality of legs 30 each include a foot member 34 insertable within a hole 16 of the secondary device 12 for grasping the secondary device 12 and at least one contact pin 60 extending from the body portion 22 to contact the secondary device 12 on an opposite surface as the foot member 34. The contact pin 60 maintains the separation between the body portion 22 and the secondary device 12 and includes a spring 66 for providing a counter force against the secondary device 12 with respect to the foot member 34.

The secondary device 12 in the preferred embodiment is generally comprised of a printed circuit board including a plurality of holes 15, 16 and electrical contact points 13 to receive the primary device 20 as well as other electrical components. In the preferred embodiment, the primary device 20 may be used to make a temporary or permanent connection to the circuit board 12 in order to program, configure, monitor, inspect or set some state(s) of one or more electronic devices or to form a debugging, programming, testing or state configuring connection between one or more devices and an in circuit debugger or debugger/programmer.

It is appreciated that in the preferred embodiment the secondary device 12 includes at least as many contact points 13 as contact pins 60 of the primary device 20 in which the contact points 13 are aligned with the contact pins 60 to be engaged by the contact pins 60 when the primary device 20 is secured to the secondary device 12. The contact points 13 may be comprised of electrically conductive pads, recessed portions with conductive material within, or various other configurations.

Figure 2:
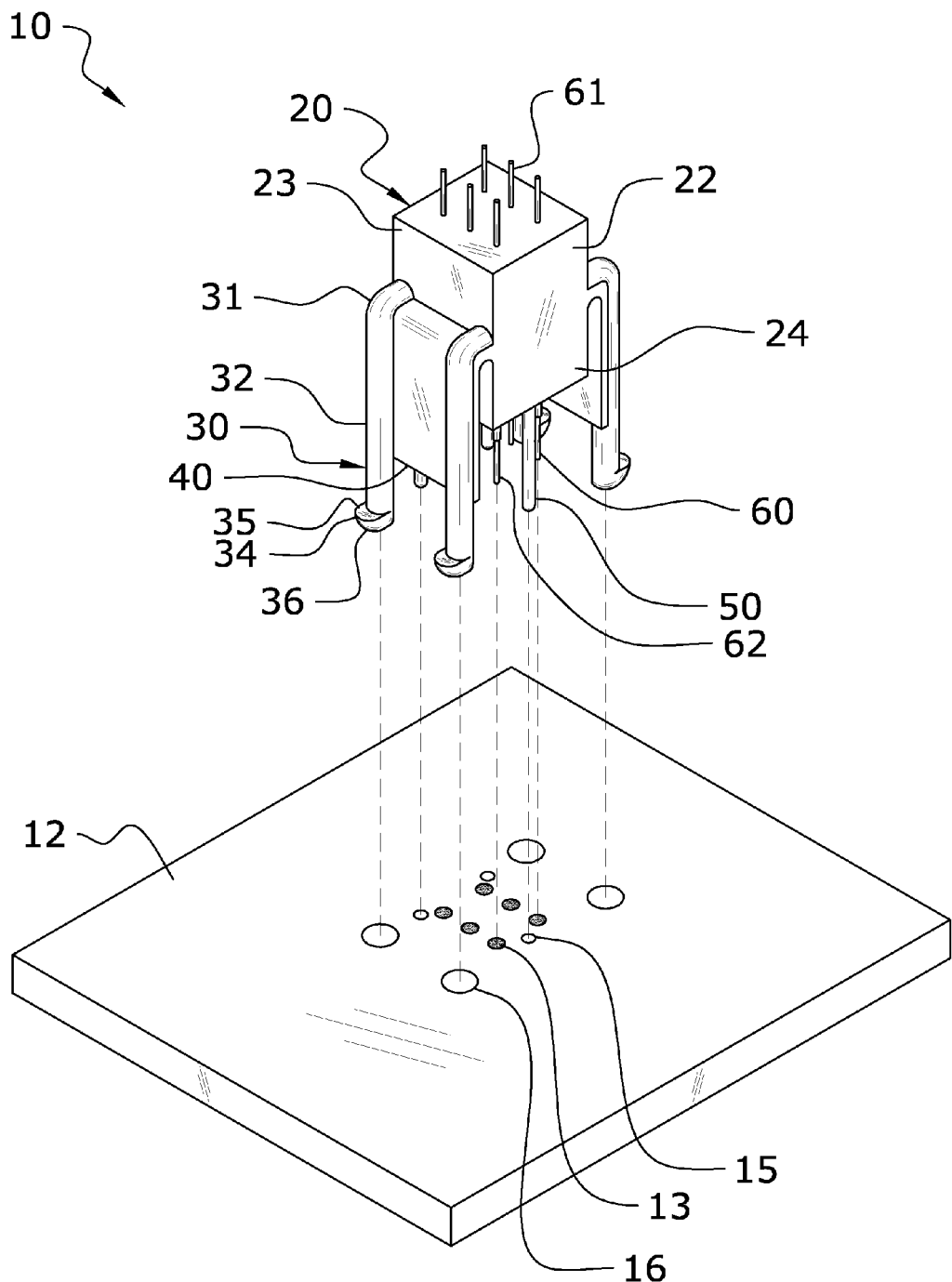
FIG. 2 is an exploded upper perspective view of the present invention.

The secondary device 12 also includes a plurality of alignment holes 15 generally positioned close to and near a perimeter around the contact points 13. The alignment holes 15 receive the alignment pins 50 of the primary device 20 to further secure the primary device 20 in a desired position about the secondary device 12 and to prevent the primary device 20 from being rotated or moved unwillingly while the alignment pins 50 are positioned within the alignment holes 15. The alignment holes 15 are also generally close fitting with respect to the alignment pins 50. In the preferred embodiment, the secondary device 12 includes an arrangement of three alignment holes 15 as illustrated in FIG. 2; however, it is appreciated that other arrangements and numbers of alignment holes 15 per set of contact points 13 may be appreciated.

The secondary device 12 also includes a plurality of securing holes 16 generally positioned close to and near a perimeter around the contact points 13 and alignment holes 15. The securing holes 16 receive the legs 30 of the primary device 20 to further secure the primary device 20 in a desired position about the secondary device 12 and to prevent the primary device 20 from being rotated or moved (vertically or horizontally) unwillingly while the legs 30 are positioned within the securing holes 16. In the preferred embodiment, the secondary device 12 includes an arrangement of four securing holes 16 as illustrated in FIG. 2; however, it is appreciated that other arrangements and numbers of securing holes 16 per set of contact points 13 may be appreciated.

Other secondary devices 12 may be used to spatially position one or more primary devices 20 other than electrical circuit boards, such as flex circuits, chip on glass, hybrid and ceramic boards, optical circuits, and other devices. It is appreciated that the term secondary device 12 may be used to refer to any such device, platform, object, board, or thing that is used to receive the primary device 20. The other secondary devices 12 may not be electrical or optical in nature. The secondary devices 12 used rather than a circuit board may be structural (e.g. part of a building, furniture, machinery, tool, or equipment) textile, paper or plastic, or otherwise primarily mechanical or aesthetic in nature. Secondary devices 12 may be raw or partially processed components of an assembly or fabrication process.

Likewise, the securing holes 16 may be omitted from the secondary device 12 in various embodiments, wherein the legs 30 are also omitted and other attachment structures, such as magnets, suction cups, adhesives, clips, static electricity, springs, compressible materials, or other mechanisms either separately or in combination may be used to spatially position one or more primary devices 20 with respect to one or more secondary devices 12 as described previously.

The primary device 20 (i.e. connector) is designed to connect to the secondary device 12 to maintain a desired spatial relationship between the primary device 20 and the secondary device 12, to easily secure the primary device 20 to the secondary device 12, to allow for easy removal of the primary device 20 from the secondary device 12 and to provide a secure and stable connection between the primary device 20 and the secondary device 12, such as to connect other auxiliary devices to the primary device 20. The spatial relationship formed between the primary device 20 and the secondary device 12 is further a separation of the lower surface of the body portion 22 of the primary device 20 from the secondary device 12 and further preferably a distal separation between thereof. The primary device 20 may be used in a variety of applications, such as those relating or not relating to electrical components.

The primary device 20 may be used to temporarily or permanently spatially position electrically conductive, mechanical or other pins, electrical or optical circuits, magnets, LED's, lasers, other light sources, light pipes, or other components or devices with respect to one or more other secondary devices 12. The primary device 20 is positioned with respect to the secondary device 12 without the use of any mating connector or other components on the secondary device 12.

The body portion 22 of the primary device 20 is generally coated in a conductive material to provide EMI (electromagnetic interference) shielding; however it need not be comprised of a conductive material. The body portion 22 is also preferably comprised of a solid configuration; however, other configurations may be appreciated. The body portion 22 is also comprised of a relatively square or rectangular shape as illustrated; however, again, other shapes and configurations may be appreciated. The primary device 20 may also be asymmetrically formed, including the legs 30, the alignment pins 50, the contact pins 60, or any combination thereof.

The body portion 22 includes at least one and preferably a plurality of legs 30 extending from the sides of the body portion 22 to connect to the bottom of the secondary device 12. The legs 30 are preferably integrally formed with the body portion 22; however, separate structures may be appreciated. The legs 30 may be comprised of generally cylindrical shapes with collapsible cores or solid cores.

The legs 30 generally include a shoulder 31 extending outwardly from approximately mid height along the sides of the body portion 22. Extending vertically downward from the shoulder 31 is an elongated portion 32. The elongated portion 32 extends sufficiently past the lower part 24 of the body portion 22 to accommodate for the thickness of the board and the desired spatial relationship between the board 12 and the bottom of the body portion 22 for the contact pins 60. The legs 30 may be rigid or flexible.

The elongated portion 32 of the legs 30 are also able to pivot with respect to the body portion 22 via the shoulder 31 of the legs 30 as illustrated in FIGS. 3 through 8. In the preferred embodiment, the pivoting action is necessary so that the legs 30 may pivot inwardly when extending through the securing holes 16 and then pivot back outwardly when the foot member 34 of the leg 30 extends past the bottom surface of the secondary device 12 thus pivoting at least partially back past the securing holes 16 to grasp the bottom surface of the secondary device 12. The foot member 34 may include a flat or tapered top surface, a flat or tapered bottom surface or many other configurations that are deemed suitable.

A foot member 34 extends from each elongated portion 32 of the legs 30. In alternate embodiments, multiple foot members 34 may be extend from each leg 30. The foot member 34 may extend outwardly, inwardly, or from either side, so long as the foot member 34 is used to grasp the bottom surface of the secondary device 12. The foot member 34 includes a flat upper surface 35 that to rest parallel and adjacent with the bottom surface and a tapered lower surface 36 to assist in guiding the legs 30 within the securing holes 16 when connecting the primary device 20 to the secondary device 12. The tapered surface may be angularly, rounded, or formed in various other manners.

It is appreciated that rather than the legs 30 being able to pivot the legs 30 may be able to switch between positions, such as through a toggle switch device. The legs 30 may further be comprised of cantilevers, which are flexed to one side, or they may flex around some center(s) using collapsible cores, which are expanded or contracted by actuating a central pin or pins. There may be other methods of achieving flex as well.

A pair of flanges 40 and preferably integrally formed with the body portion 22 also extend from the sides of the body portion 22 along an inside surface of the legs 30 as illustrated in FIGS. 1 and 2. The flanges 40 may be attached to the legs 30 or separately formed with the legs 30. Each side of the body portion 22 preferably includes a single flange 40 that spans across both side legs 30 as illustrated. The flange 40 serves to stabilize the legs 30 to prevent breakage. The flange 40 also serves to prevent the body portion 22 from moving to close to the secondary device 12 and thus damaging the contact pins 60.

The lower portion 62 of the flanges 40 extends to a vertical point along the legs 30 where the foot members 34 may grasp the bottom surface of the secondary device 12 and the contact pins 60 may properly engage the contact points 13 of the secondary device 12. The flanges 40 thus prevent the body portion 22 from moving downwards past a necessary point to prevent breakage of the pins. The distance that the flanges 40 extend downwards from the body portion 22 along the legs 30 thus forms the minimum distance and generally the utilized spatial relationship of the body portion 22 and the secondary device 12. It is appreciated that the flanges 40 are also able to pivot or move with the legs 30.

The primary device 20 also preferably includes a plurality of alignment pins 50 extending from the lower part 24 of the body portion 22 vertically downwards to align with and extend partially or wholly through the alignment holes 15 of the secondary device 12. The alignment pins 50 may be comprised of a conductive or non-conductive material. A primary use of the alignment pins 50 is to add further stability to the connection between the primary device 20 and the secondary device 12 to prevent breakage of the legs 30 or contact pins 60 of the primary device 20 from rotating, bumping into, or otherwise moving the primary device 20 when connected to the secondary device 12.

The alignment pins 50, in the preferred embodiment, are comprised of a strong structure and generally have a larger diameter than the contact pins 60. The alignment pins 50, contact pins 60, and legs 30 may be square, triangular, or any other regular or irregular shape, and may have a uniform or non uniform cross section. The alignment pins 50 are also generally longer than the contact pins 60 and extend past the flanges 40 so that the alignment pins 50 may extend sufficiently through or into the alignment holes 15. It is appreciated that the alignment pins 50 may extend completely through the alignment holes 15 to the other side of the secondary device 12, wherein clips (e.g. alligator clips), or other connecting elements may connect to the alignment pins 50 to provide an electrical connection. The upper portion 61 of the alignment pins 50 thus may be electrically connected together, to the contact pins 60, or various other electrical components or circuitry. The alignment pins 50 and the legs 30 may also be comprised of differing or similar diameters.

The primary device 20 also preferably includes a plurality of contact pins 60 extending from the lower part 24 of the body portion 22 vertically downwards to align with contact the contact points 13 of the secondary device 12. The contact pins 60 are generally comprised of a conductive material. The contact pins 60 thus provide the primary electrical connection for the primary device 20 with the secondary device 12 in the electrical circuit board embodiment of the present invention.

The contact pins 60 may extend solely from the lower part 24 of the body portion 22 or may extend all the way through the body portion 22 via a plurality of holes (not shown). In the latter case, the upper portion 61 of the contact pins 60 extending from the upper part 23 of the body portion 22 is electrically connected to the lower portion 62, wherein clips, soldering or crimping to an electrical cables, or other components may be connected to the upper portion 61 of the contact pins 60 to extend the electrical connection provided by the engagement of the contact pins 60 with the contact points 13. It is appreciated that the number of contact pins 60 may vary, such as but not limited to 2, 3, or 4 row designs with 10, 14, or 20 pins, as well as various other numbers of contact pins 60.

The lower portion 62 of the contact pins 60 is also able to vertically adjust via a spring 66. A spring 66 is interconnected between a catch portion 63 of the contact pin 60 and the lower part 24 of the body portion 22. The spring 66 may also be retained in place by a retainer 65 surrounding the spring 66. It is appreciated that the spring 66 may extend around the contact pin 60 or may be positioned at an end of the contact pin 60, wherein the catch portion 63 forms the top of the contact pin 60. It is appreciated that the springs 66 may be omitted, included in only a portion of the legs 30 or integral with the legs 30.

The lower portion 62 of the contact pin 60 is able to adjust vertically upwards when moving the primary device 20 closer to the secondary device 12 via extending the legs 30 through the securing holes 16. When the foot members 34 catch the bottom of the secondary device 12, the spring 66 exerts an outward force against the contact pin 60 towards the secondary device 12 thus forcing the contact pin 60 to remain engaged to the contact point 13 of the secondary device 12 and to maintain the spatial relationship between the body portion 22 and the secondary device 12 via effectively sandwiching the secondary device 12 between the contact pins 60 and the upper surface 35 of the foot members 34. The contact pins 60 may further be comprised of a telescoping structure. Telescoping spring-loaded contact pins 60, which compress their springs 66 when pressed against the top surface of the secondary device 12. It is also appreciated that other embodiments may use rigid, flexible or other styled contact pins 60. It is appreciated that the pins 60 may be inserted into plated holes within the contact points 13 to help align the pins 60. The tips of the pins 60 may be sharp, include crowns, or be textured to contact multiple contact points 13.

In the event that a contact pin 60 tip is damaged or for any other reason must be replaced, it can be pulled out and replaced without affecting the upper portion 61 of the contact pin 60 connected to the cable. Other embodiments may make use of one-piece contact pins 60 or contact pins 60 of more than two components. The preferred embodiment shows the contact pins 60 parallel to the legs 30. In other embodiments, the contact pins 60 may have other orientations with respect to the legs 30. The tips of the contact pins 60 that are to contact the circuit board also preferably define a plane. In other embodiments, the tips of the contact pins 60 may lie on more than one plane, may define a geometrical shape other than a plane, or may have any other spatial arrangement.

In alternate embodiments, circuitry, magnets, cables, may be assembled or affixed to each other by a variety of means including over molding, soldering, crimping, riveting, casting, extruding, stamping, putting in place or in addition to the contact pins 60. In other embodiments (for example a light pipe design) the entire primary device 20 may be a single formed or fabricated component, or features formed from separate components may be formed from one or more common components. In an over mold embodiment, the body portion 22 may be over molded onto the contact pins 60. The primary device 20 may also be over molded onto both the contact pins 60 and cable to form a single entity. Such an embodiment greatly increases the robustness of the primary device 20 as it protects the connections between the contact pins 60 and cable from damage.

Other embodiments may position primary devices 20 to communicate inductively, optically, via RF (radio frequency), or by other means with one or more secondary devices 12. Other embodiments may position primary devices 20 to illuminate, receive illumination, magnify, channel (e.g. light pipe) or reflect optical, electrical, or auditory energy, provide power to or from, or provide charge to or from secondary devices 12. Other embodiments may be used to inductively couple with one or more secondary devices 12 or position a sensor or transducer with respect to one or more secondary devices 12. Other embodiments may position primary devices 20 for structural, mechanical, aesthetic or other purposes with respect to secondary devices 12.

Figure 12:
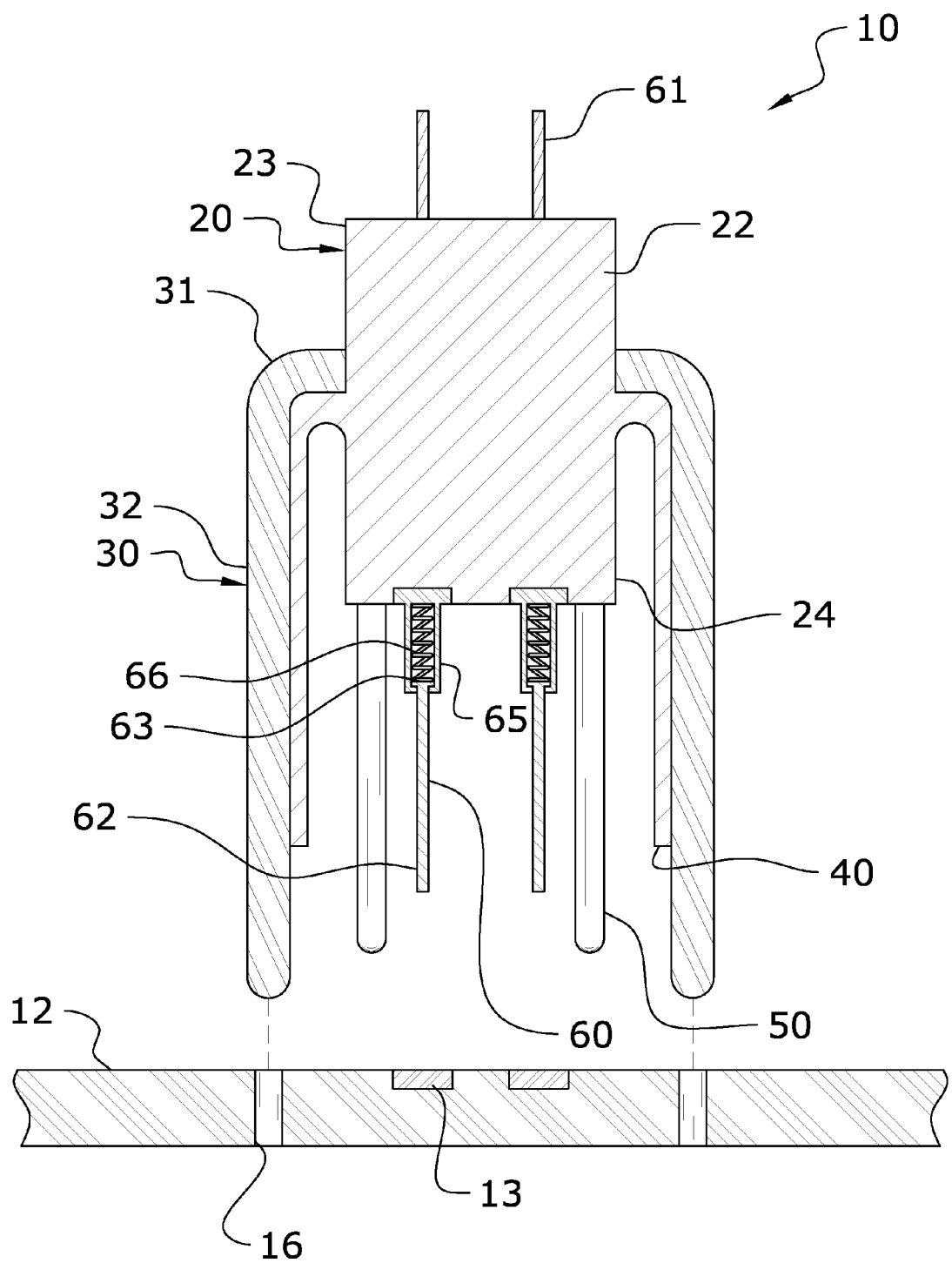
FIG. 12 is a side sectional view illustrating an alternate embodiment of the primary device exploded from and aligned with the secondary device.
Figure 13:
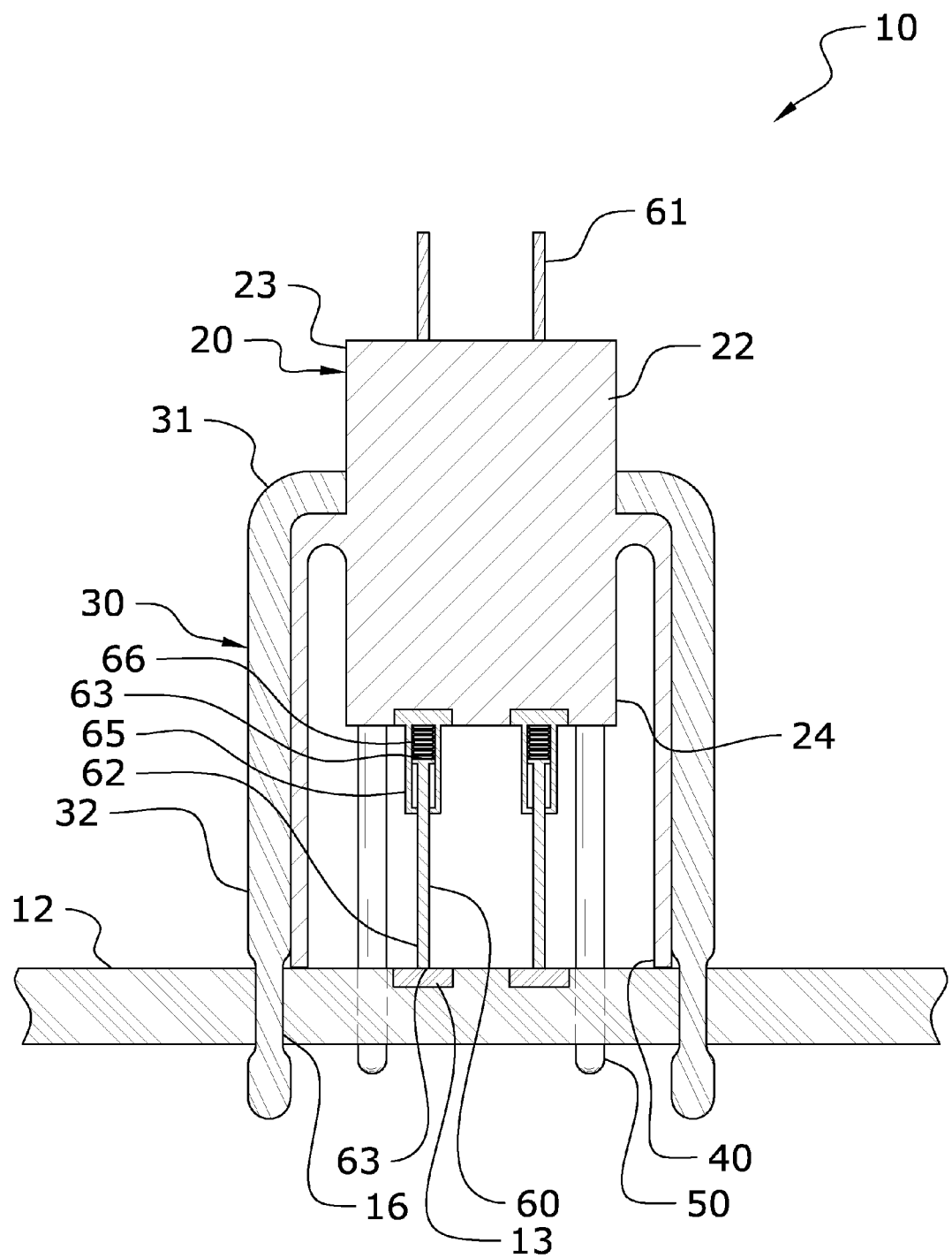
FIG. 13 is a side sectional view illustrating the alternate embodiment of FIG. 12 attached to the secondary device.

In another alternate embodiment, the legs 30 may also be comprised of a resilient or rubber like material that is secured within the holes 16 of the secondary device 12 as illustrated in FIGS. 12 and 13. The legs 30 are compressed when inserting within the holes 16 and then expand to prevent removal of the primary device 20 from the secondary device 12 when not desired. The contact pins 60 may or may not include springs 66 in this embodiment. The compressible leg 30 can also be a football or banana plug shape in further alternate embodiments. The legs 30 include a compressed position and an expanded position, wherein a first portion of the legs 30 positioned within the openings 16 is in said compressed position and a second portion of the legs 30 positioned outside the openings 16 is in the expanded position.

Figure 14:
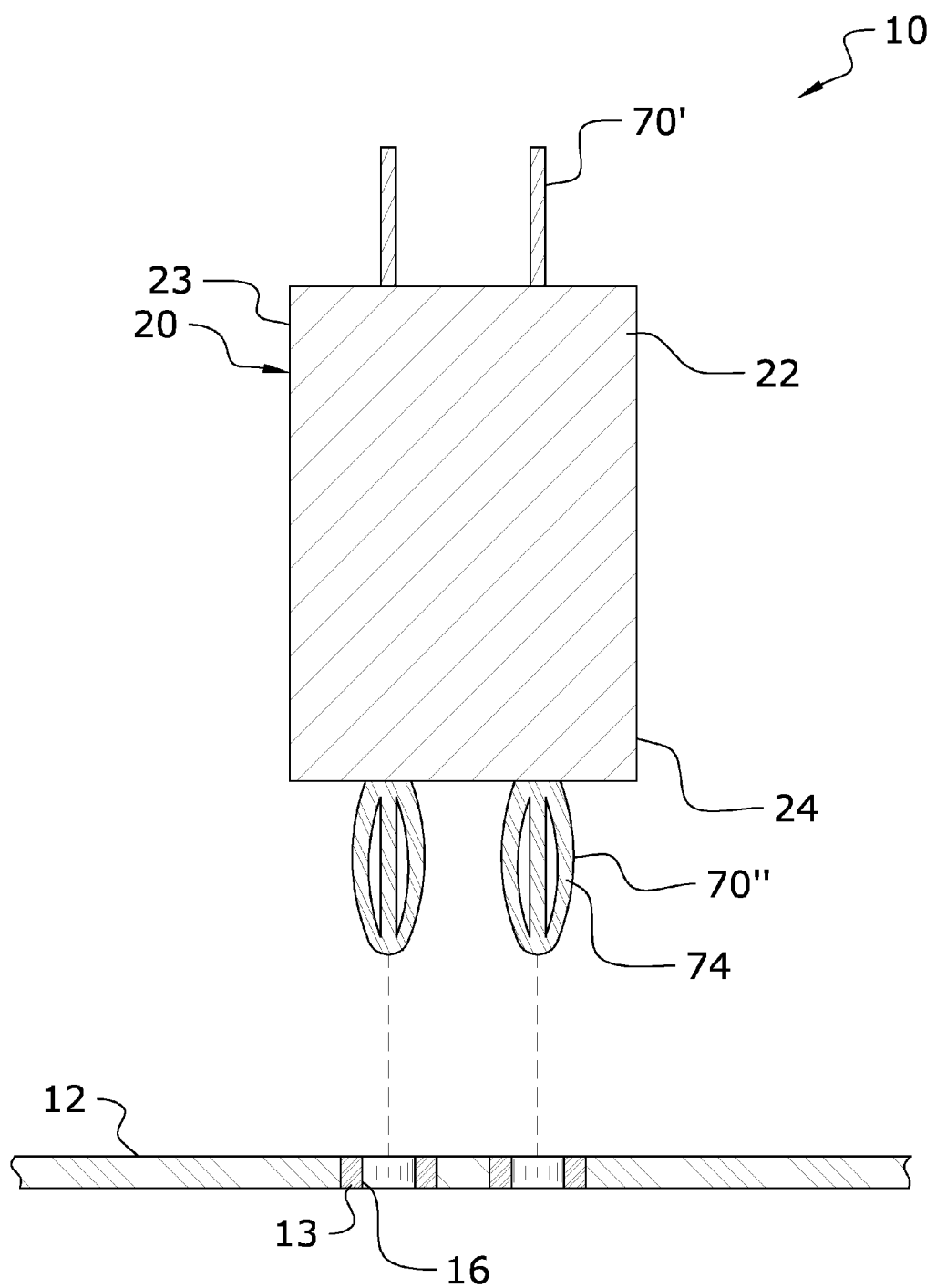
FIG. 14 is a side sectional view illustrating another alternate embodiment of the primary device exploded from and aligned with the secondary device.
Figure 15:
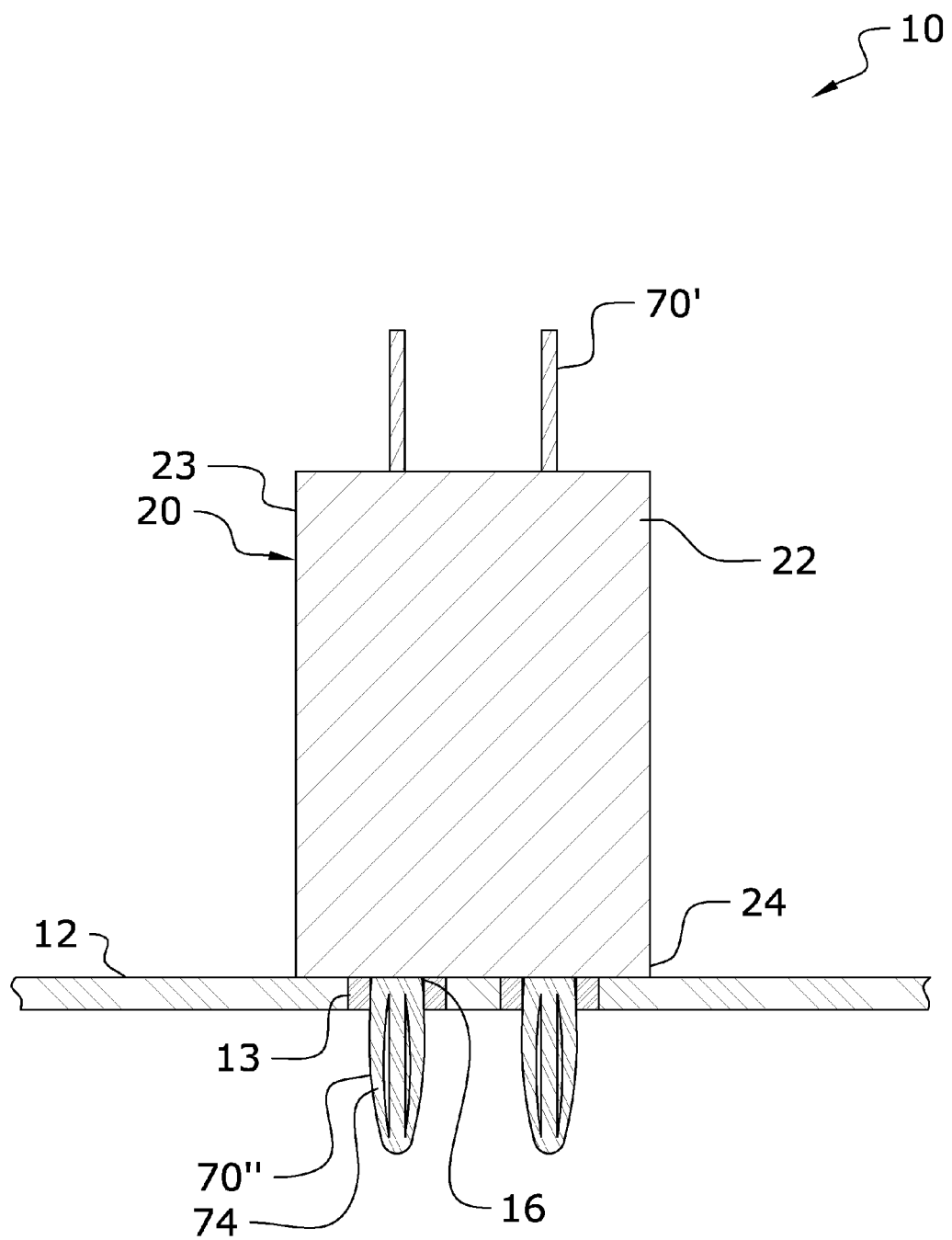
FIG. 15 is a side sectional view illustrating the alternate embodiment of FIG. 14 attached to the secondary device.

In addition, a contact pin 60 and an alignment pin 50 (and even a leg 30) may be combined into a single conductive member 70' serving more than one of these functions, such as a pin that is constructed like a banana plug pin as illustrated in FIGS. 14 and 15. The embodiment may include a plurality of banana type plug pins. Outer strips of the conductive member 70', defining resilient members 74, collapse toward its center as it is pushed through the hole and then relax outward as it clears the hole. The resilient member 74 provides a biasing force upon the secondary device 12 to secure the primary device 20 to the secondary device 12 at said desired spatial relationship by expanding within the opening 16 to prevent the primary device 20 from being easily removed from the opening 16. The foot conductive member 70' engages the contact points 13 surrounding the openings 16. The conductive member 70' is electrically connected to the conductive member 70" extending outwardly from the upper surface of the device 20. This would align, make electrical contact, and retain the part all at the same time thus achieving the functions of the alignment pin, contact pin, and leg respectively, all in one pin as illustrated in FIGS. 14 and 15.

Figure 16:
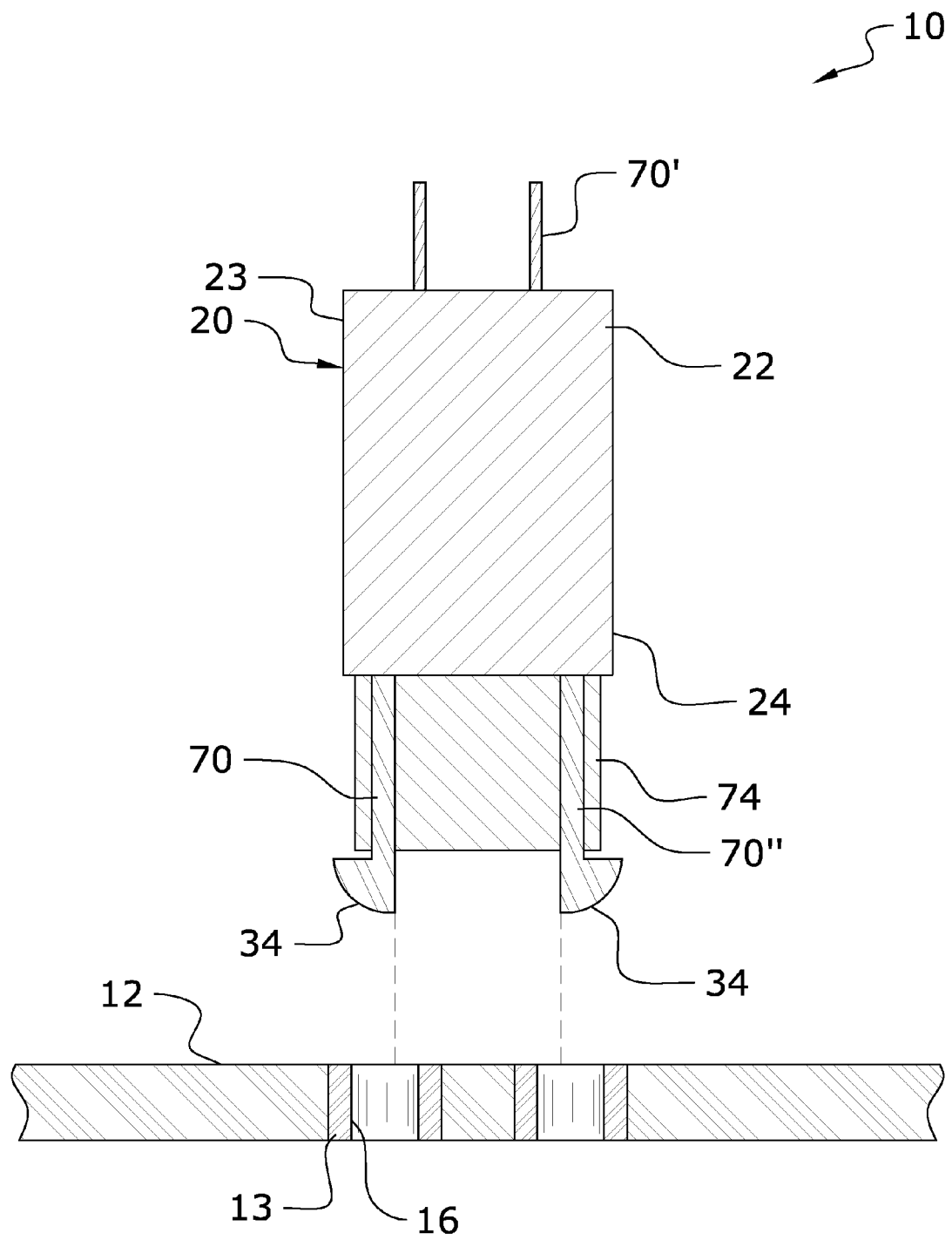
FIG. 16 is a side sectional view illustrating yet another alternate embodiment of the primary device exploded from and aligned with the secondary device.
Figure 17:
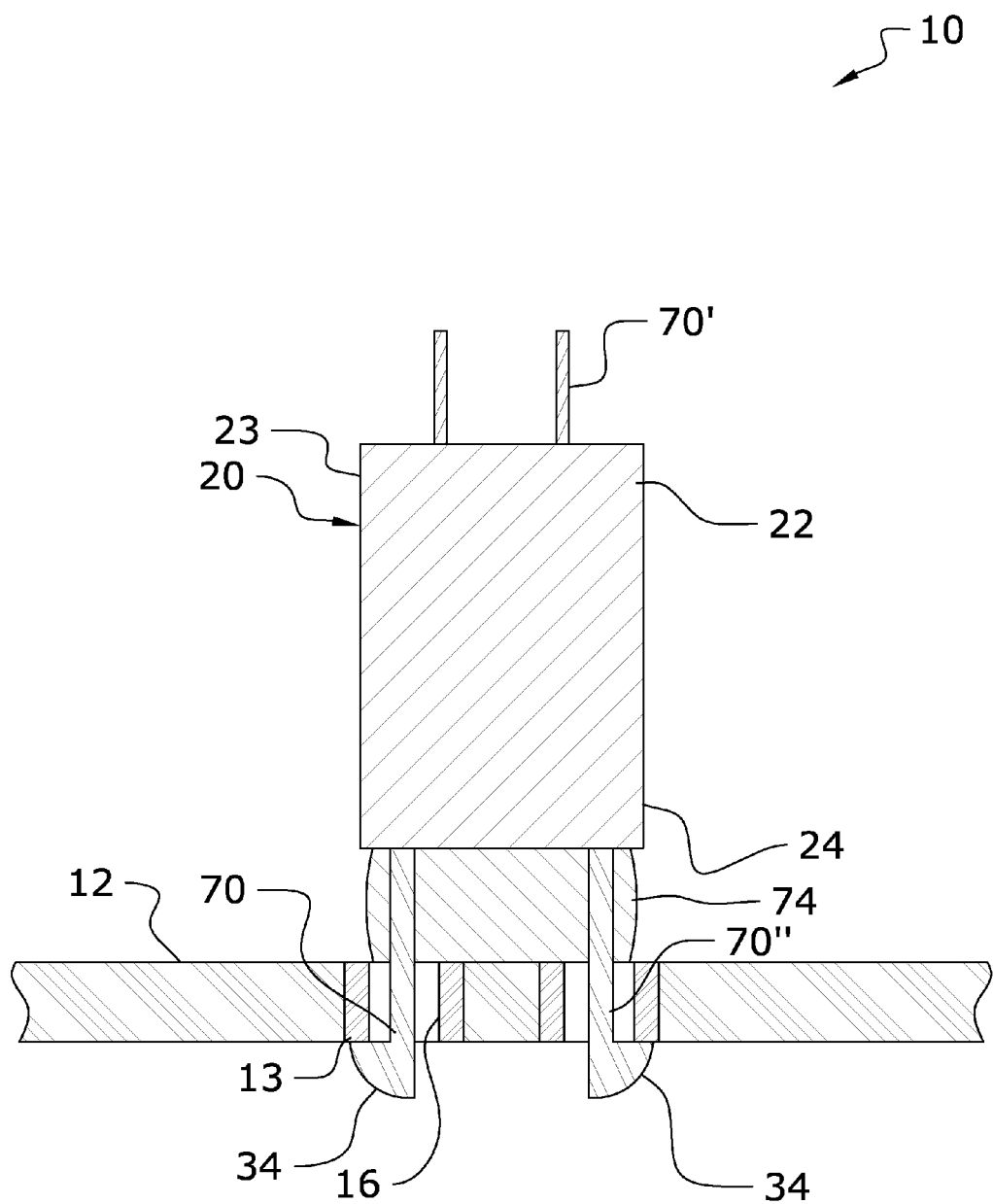
FIG. 17 is a side sectional view illustrating the alternate embodiment of FIG. 16 attached to the secondary device.
Figure 18:
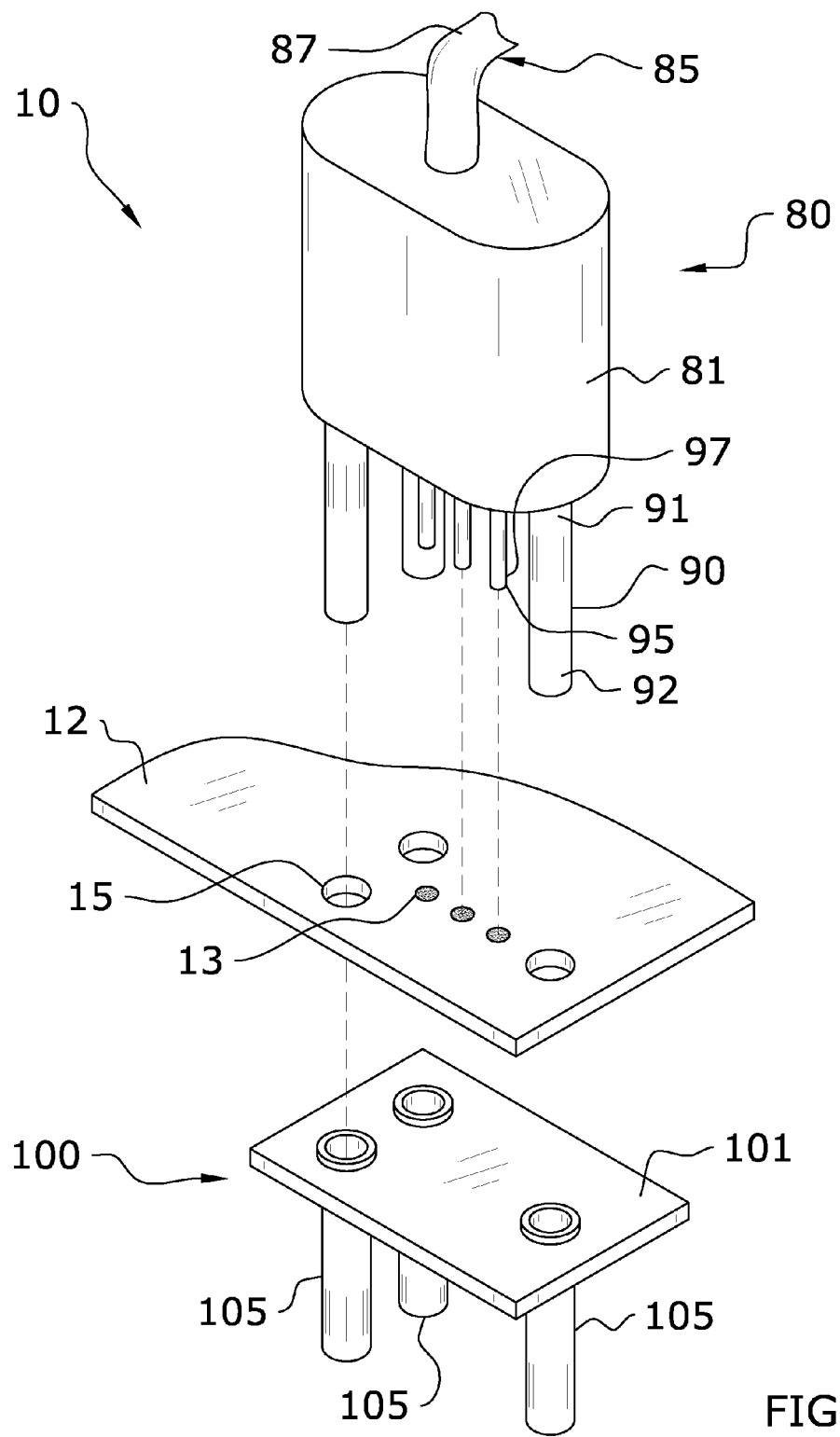
FIG. 18 is an exemplary exploded upper perspective view of another alternate embodiment of the present invention.
Figure 19:
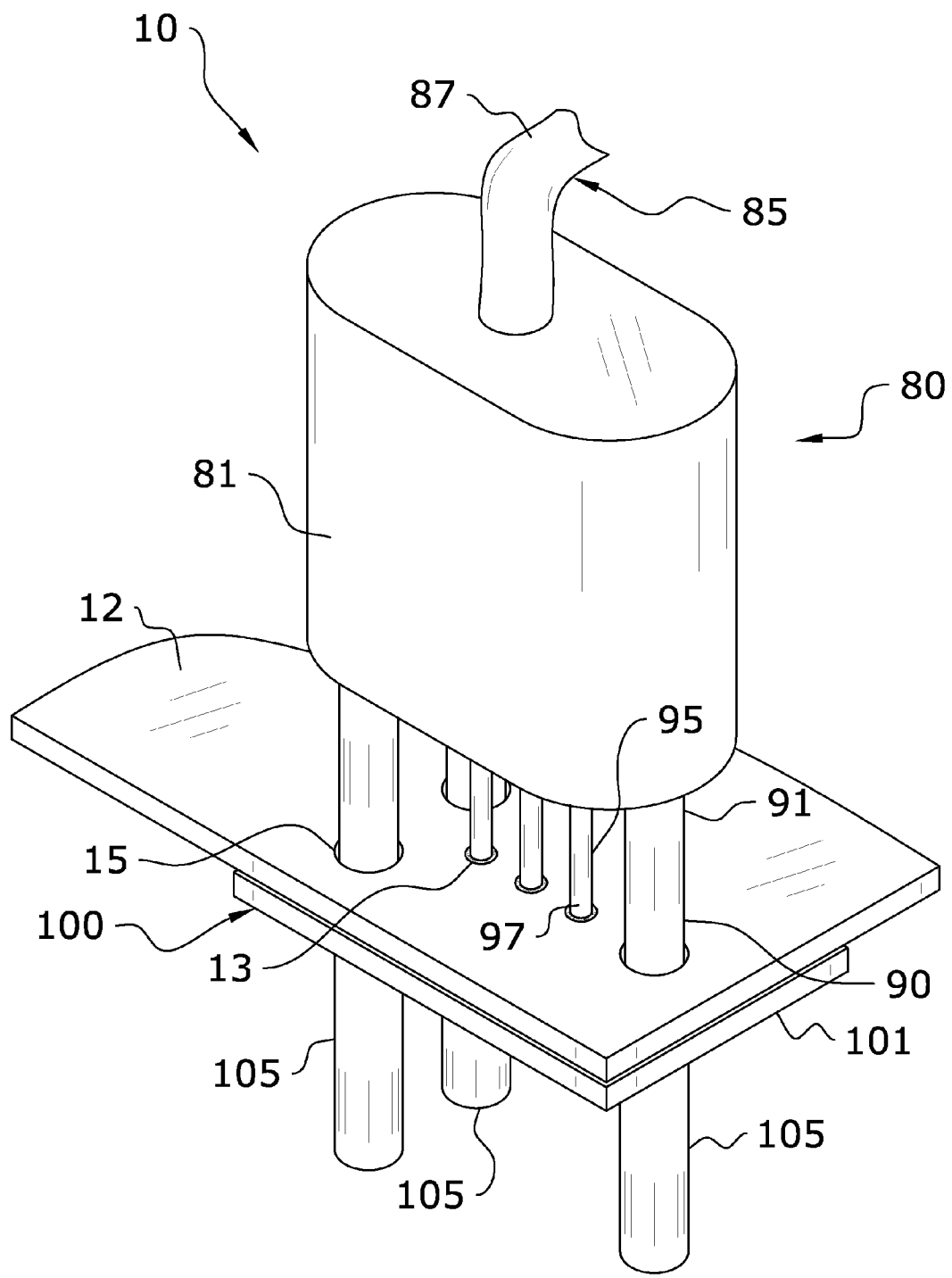
FIG. 19 is an exemplary upper perspective view of the alternate embodiment of FIG. 18.
Figure 20:
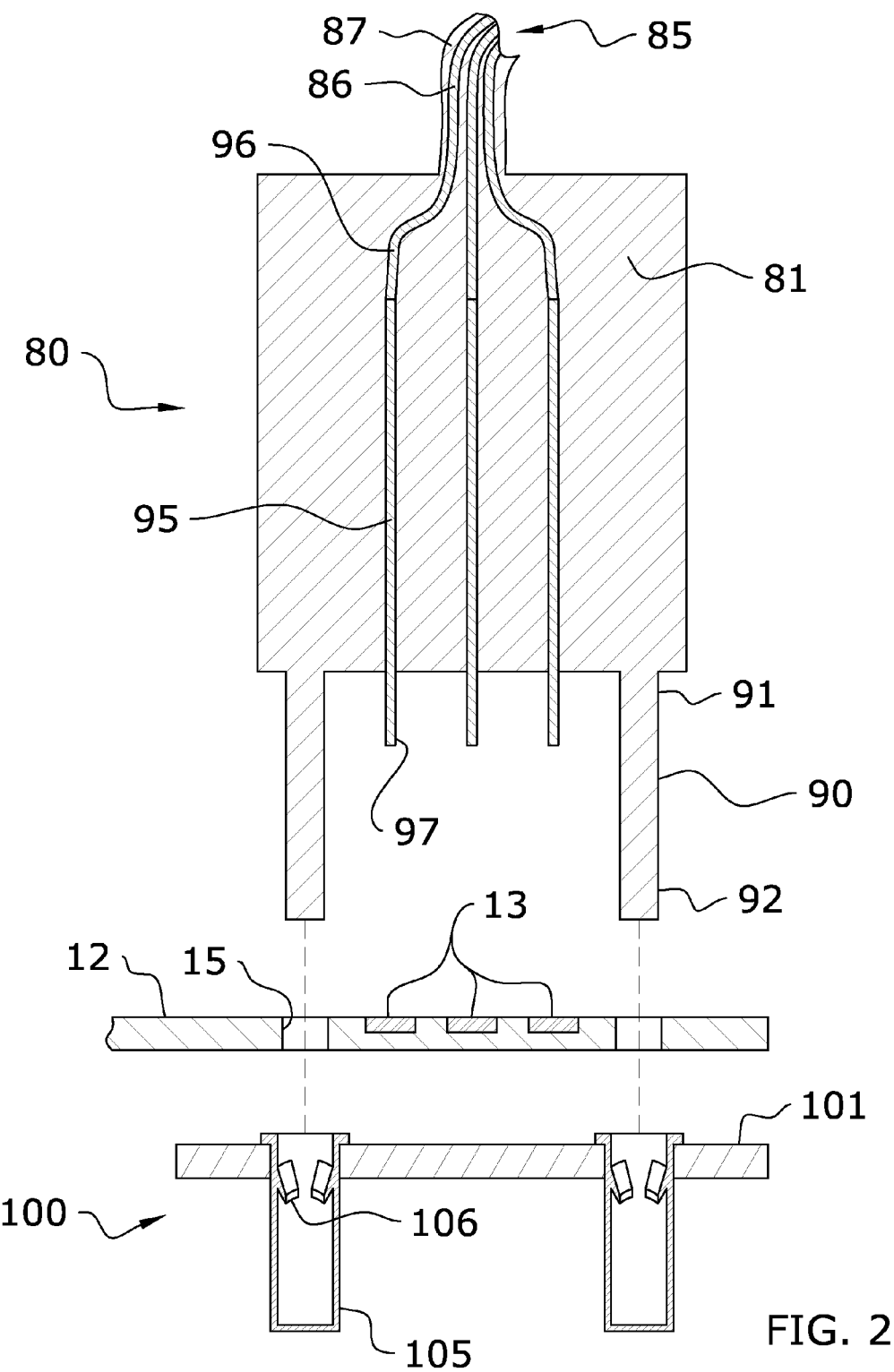
FIG. 20 is an exemplary exploded section view of the alternate embodiment of FIG. 18.
Figure 21:
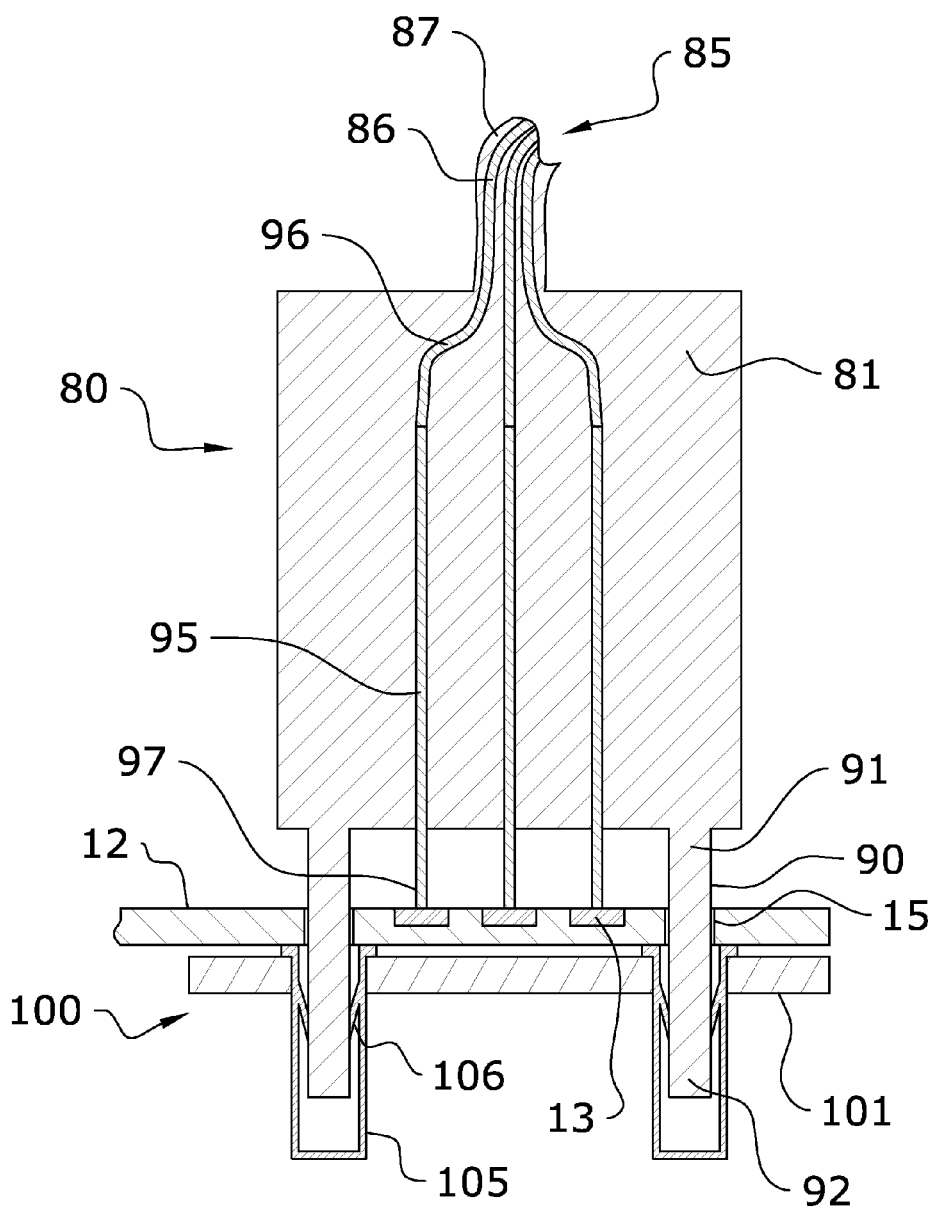
FIG. 21 is an exemplary section view of the alternate embodiment of FIG. 18.

In yet another alternate embodiment as illustrated in FIGS. 16 and 17, a contact pin 60 and an alignment pin 50 (and even a leg 30) may be combined into a single conductive member 70'. The conductive member 70' includes a foot member 34 integral with and conductive like the conductive member 70' to function similar as in the preferred embodiment in holding the underside of the secondary device 12. The embodiment also includes a resilient member 74 extending downward from the body portion 22 along the length of the combined component. The resilient member 74 which is connected to and between the conductive member 70' and the body portion 22 provides a spring like function to keep the foot members 34 tight against the underside of the secondary device 12 and thus primary device 20 secured to the secondary device 12 and is positioned between the body portion 22 and the secondary device 12. The resilient member 74 provides a biasing force upon the secondary device 12 to secure the primary device 20 to the secondary device 12 at said desired spatial relationship. The foot member 34 and/or conductive member 70' engage the contact points 13 surrounding the openings 16. The resilient members 74 of any of the embodiments may be rubbery, flexible metal, plastic, spring like or any material, shape or configuration to provide a bias force against the secondary device 12. The conductive member 70' is electrically connected to the conductive member 70" extending outwardly from the upper surface of the device 20.

Figure 3:
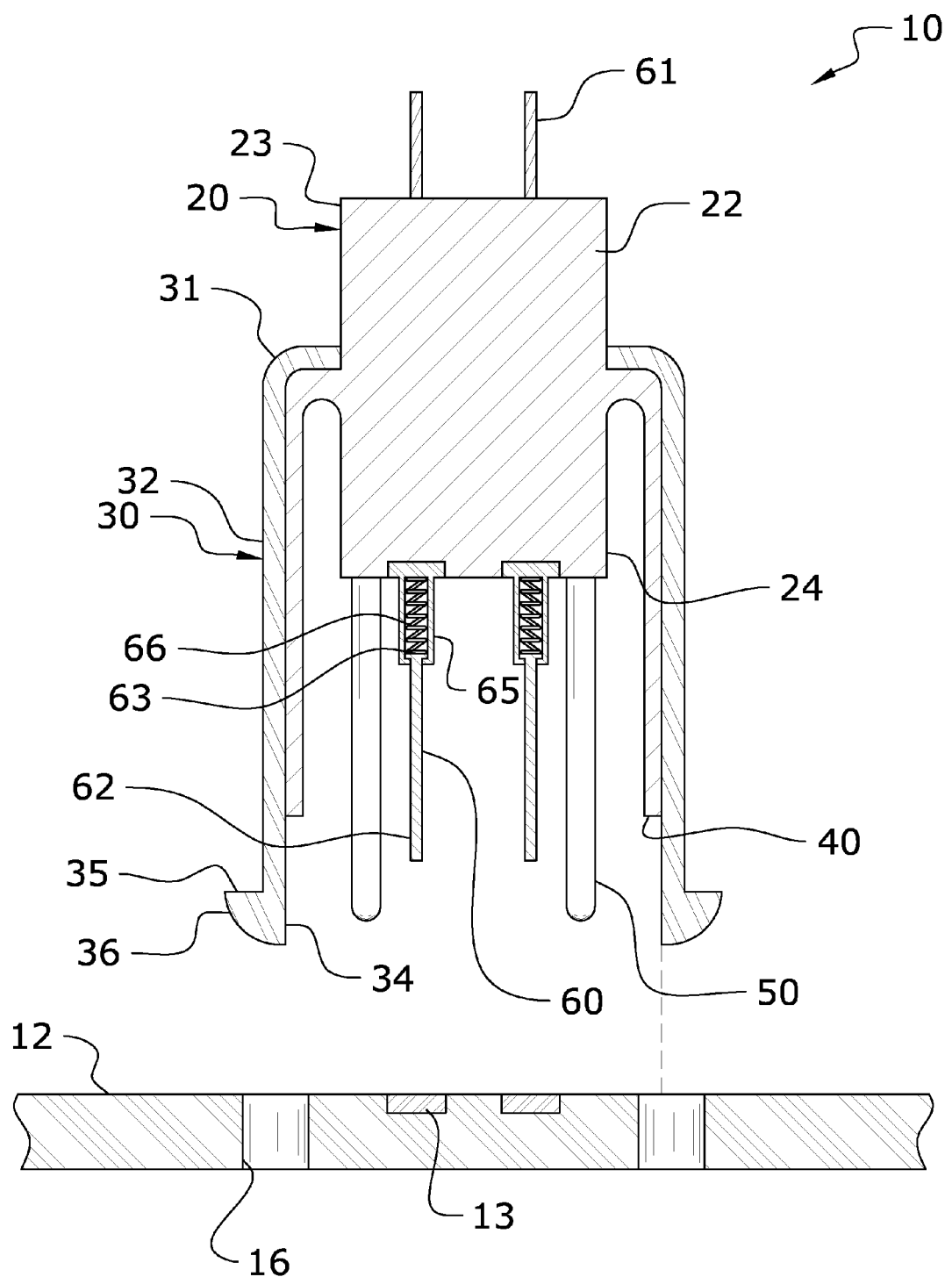
FIG. 3 is a side sectional view illustrating the primary device exploded from and aligned with the secondary device.
Figure 4:
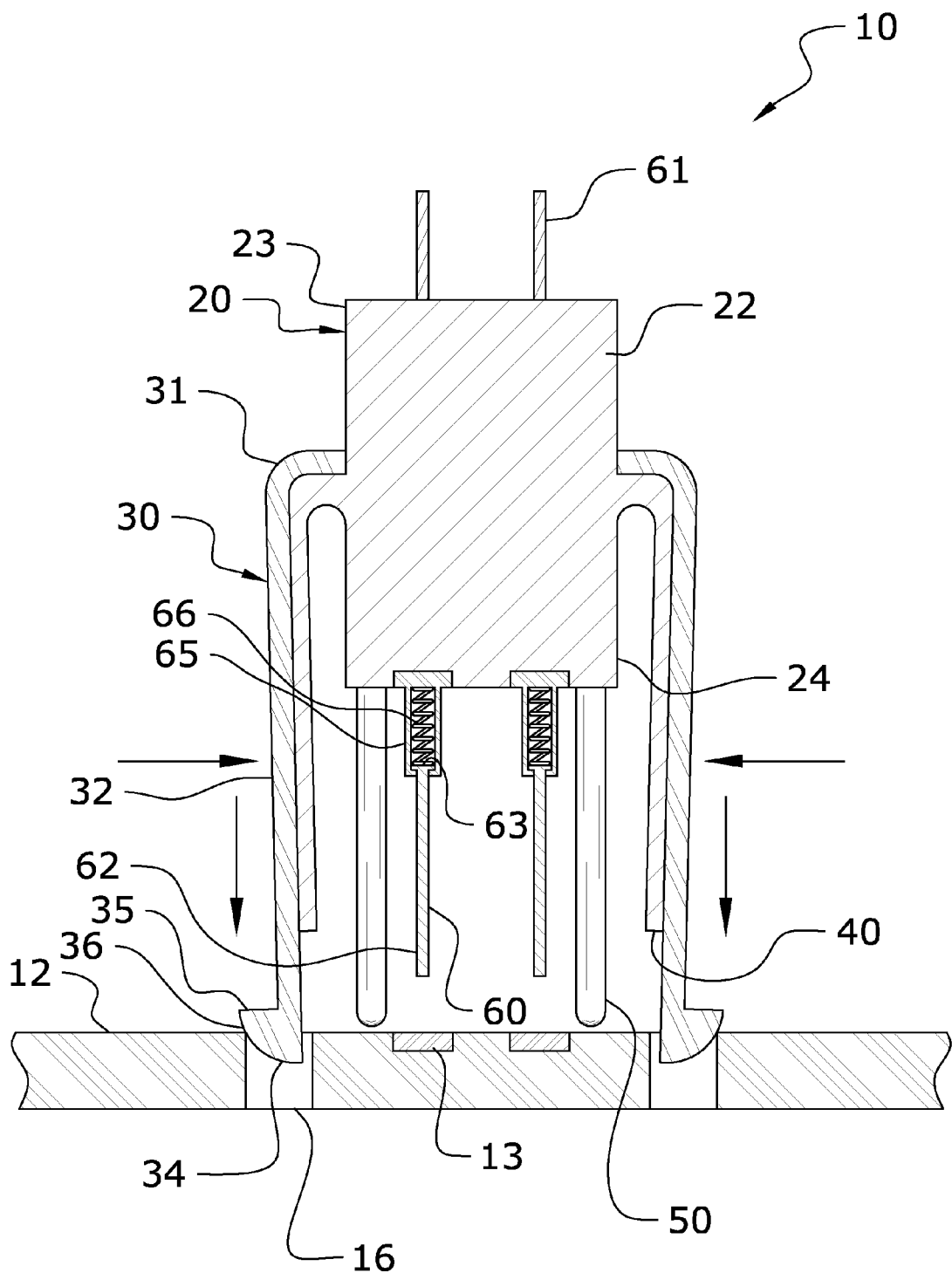
FIG. 4 is a side sectional view illustrating the primary device being initially inserted within the secondary device.

In use, the primary device 20 is first aligned with the contact points 13, alignment holes 15, and securing holes 16 of the secondary device 12 as illustrated in FIGS. 2 and 3. The legs 30 are then extended within the securing holes 16 of the secondary device 12. As the legs 30 extended within the securing holes 16, the tapered portion guides the legs 30 inwards, wherein the legs 30 pivot inwards to extend within the securing holes 16 as illustrated in FIG. 4.

Figure 5:
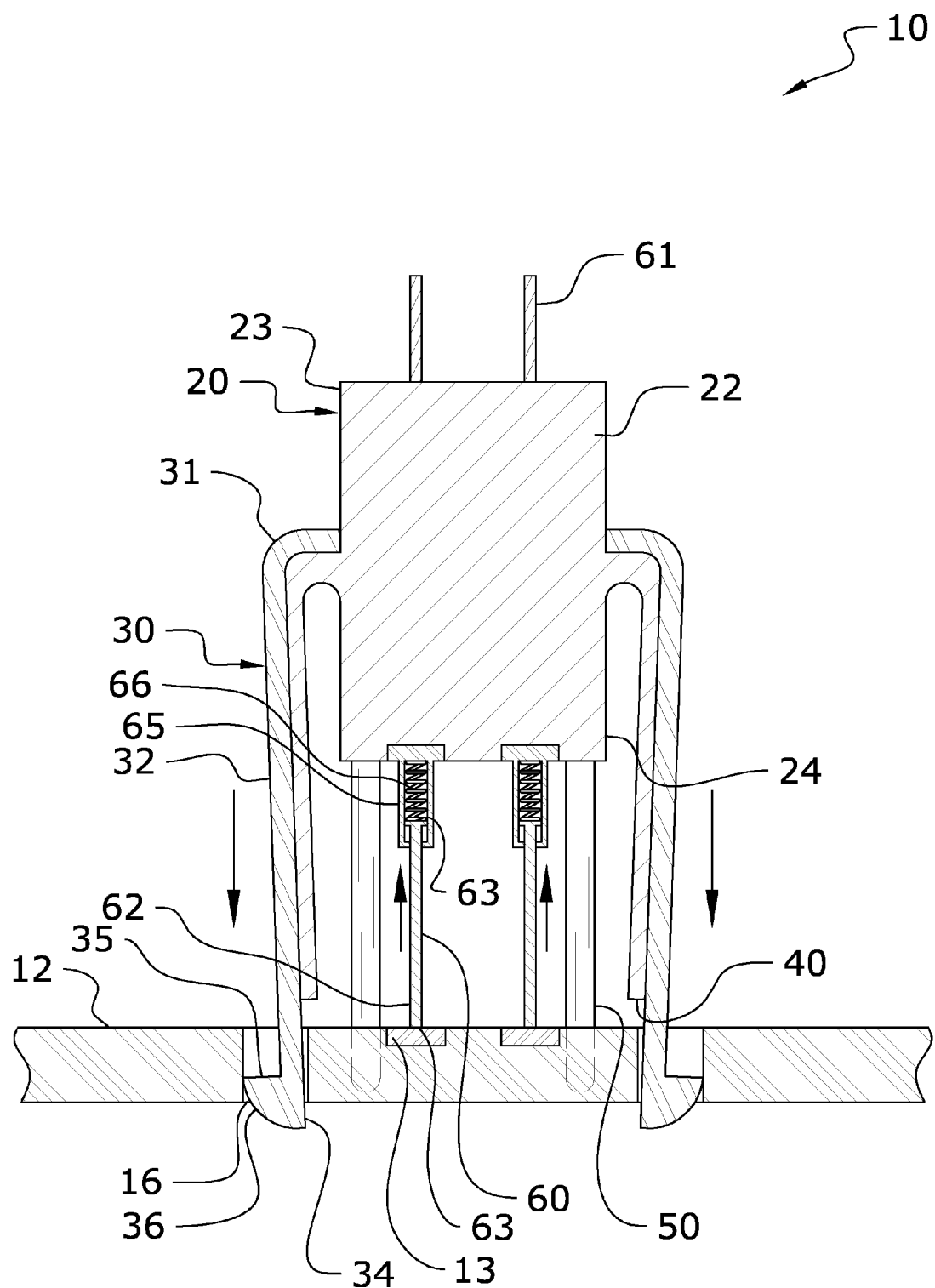
FIG. 5 is a side sectional view illustrating the primary device being further inserted within the secondary device.

The legs 30 are further extended through the securing holes 16, while the alignment pins 50 additionally enter the alignment holes 15, and the contact pins 60 engage the contact points 13 as illustrated in FIG. 5. As the contact pins 60 engage the contact points 13, the contact pins 60 are pushed upwards or away from the contact points 13 causing the spring 66 to compress as illustrated in FIG. 5.

Figure 6:
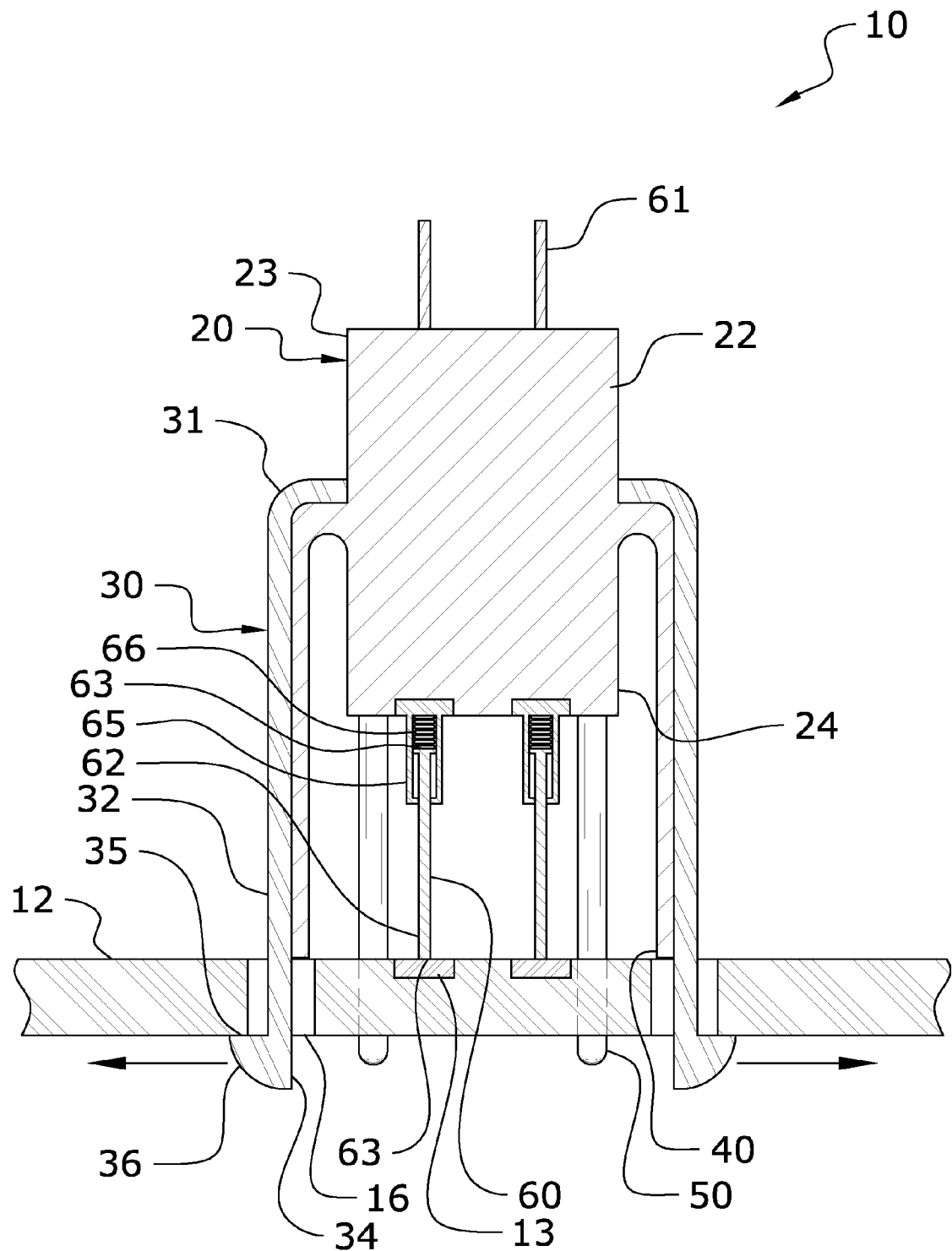
FIG. 6 is a side sectional view illustrating the primary device attached to the secondary device.

When the upper surface 35 of the foot members 34 of the legs 30 clears the bottom surface of the secondary device 12, the "springiness" of the legs 30 automatically cause the legs 30 to pivot back outwards toward an initial position thus allowing the upper surface 35 of the foot members 34 to grasp the bottom surface of the secondary device 12 as illustrated in FIG. 6.

The alignment pins 50 may also extend beyond the bottom surface of the secondary device 12 at this time. In addition, the spring 66 exerts an outward force upon the contact pins 60 so that the contact pins 60 and the spring 66 maintain a spatial relationship between the primary device 20 and the secondary device 12. It is appreciated that the force of the spring 66 effectively sandwiches the secondary device 12 between the lower portion 62 of the contact pins 60 and the upper surface 35 of the foot members 34.

Figure 7:
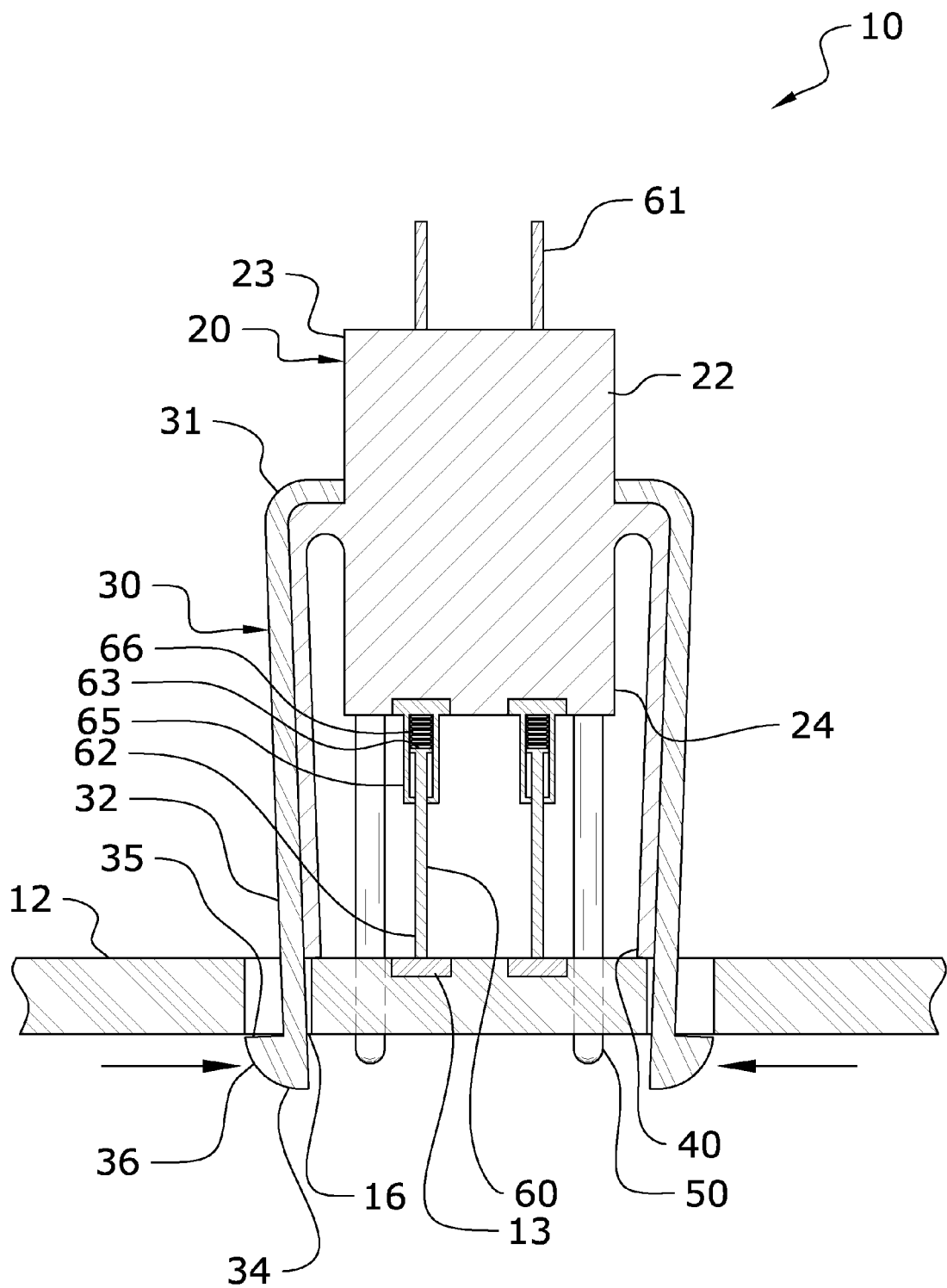
FIG. 7 is a side sectional view illustrating the primary device being adjusted to be removed from the secondary device.
Figure 8:
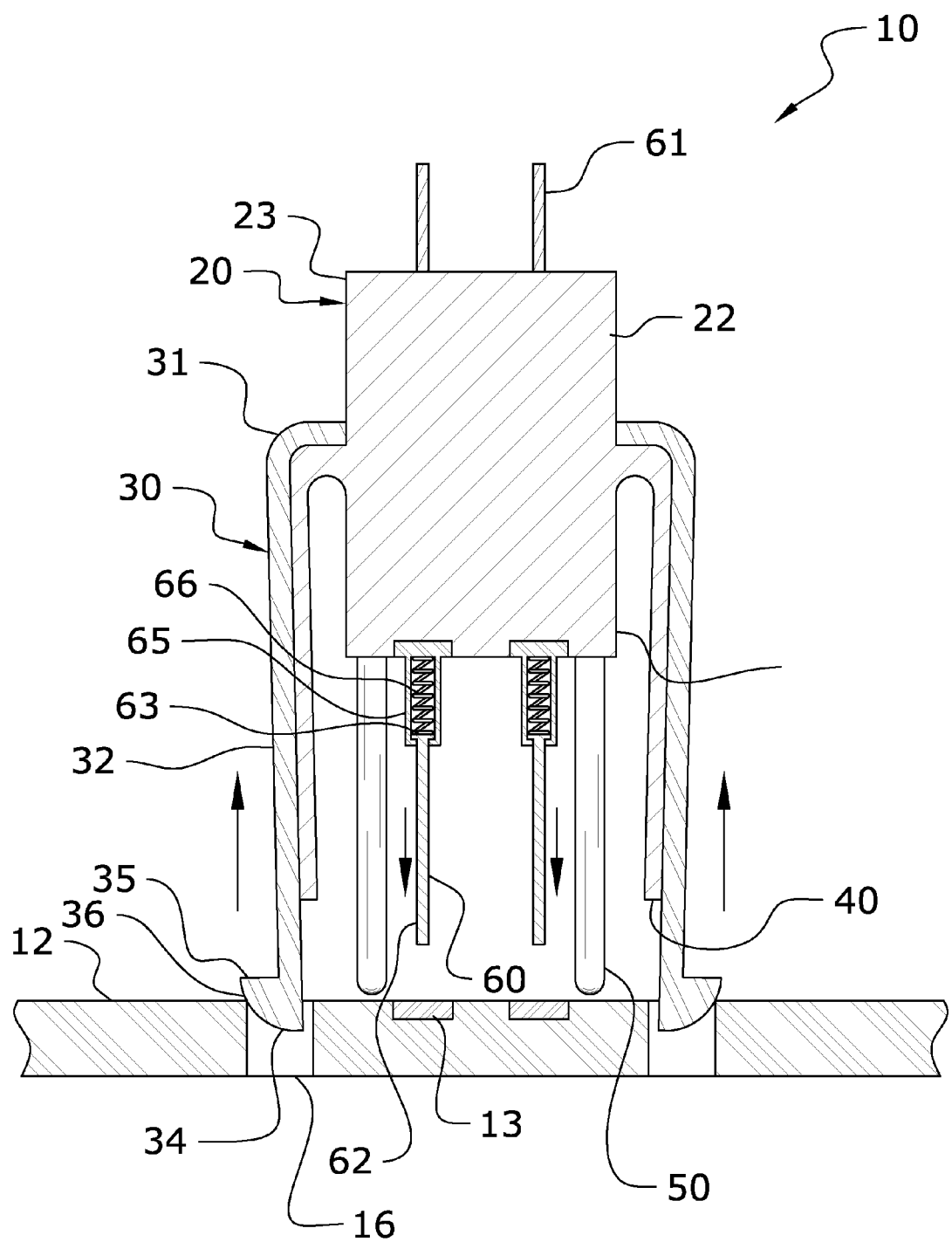
FIG. 8 is a side sectional view illustrating the primary device being removed from the secondary device.
Figure 9:
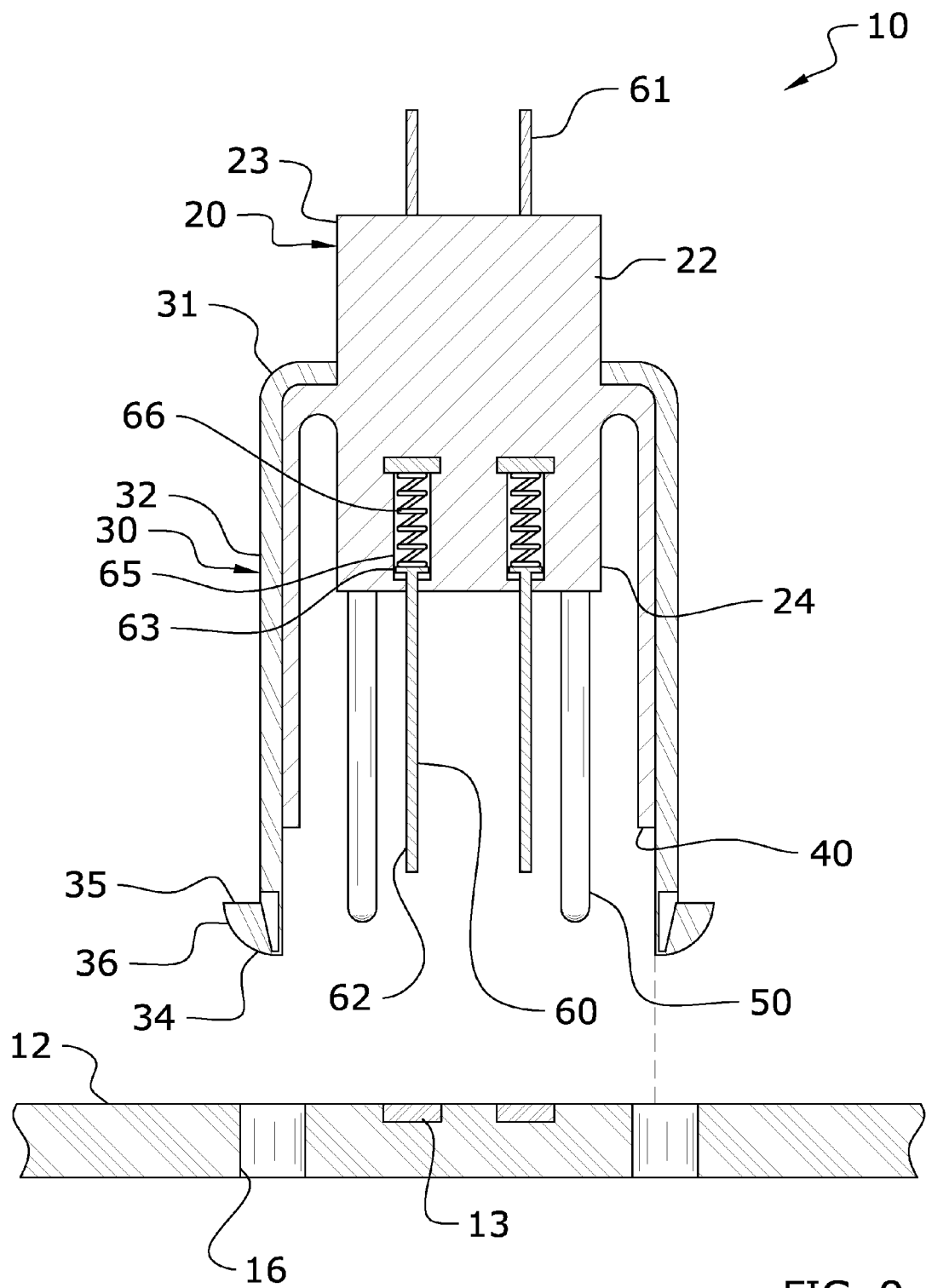
FIG. 9 is a side sectional view illustrating the primary device removed from the secondary device.
Figure 10:
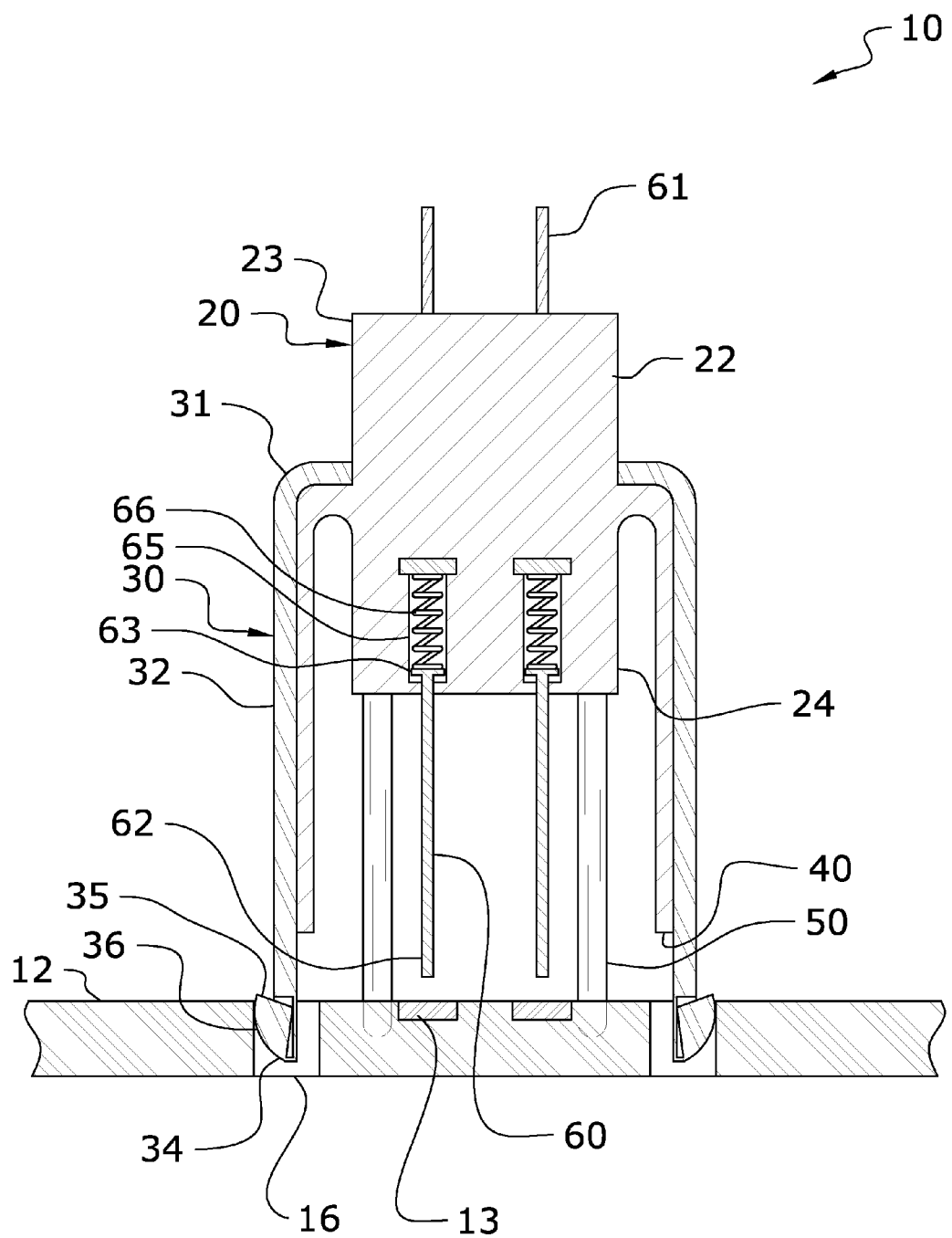
FIG. 10 is a side sectional view illustrating the primary device being initially inserted within the secondary device, wherein the primary device includes alternate types of adjustable foot members.
Figure 11:
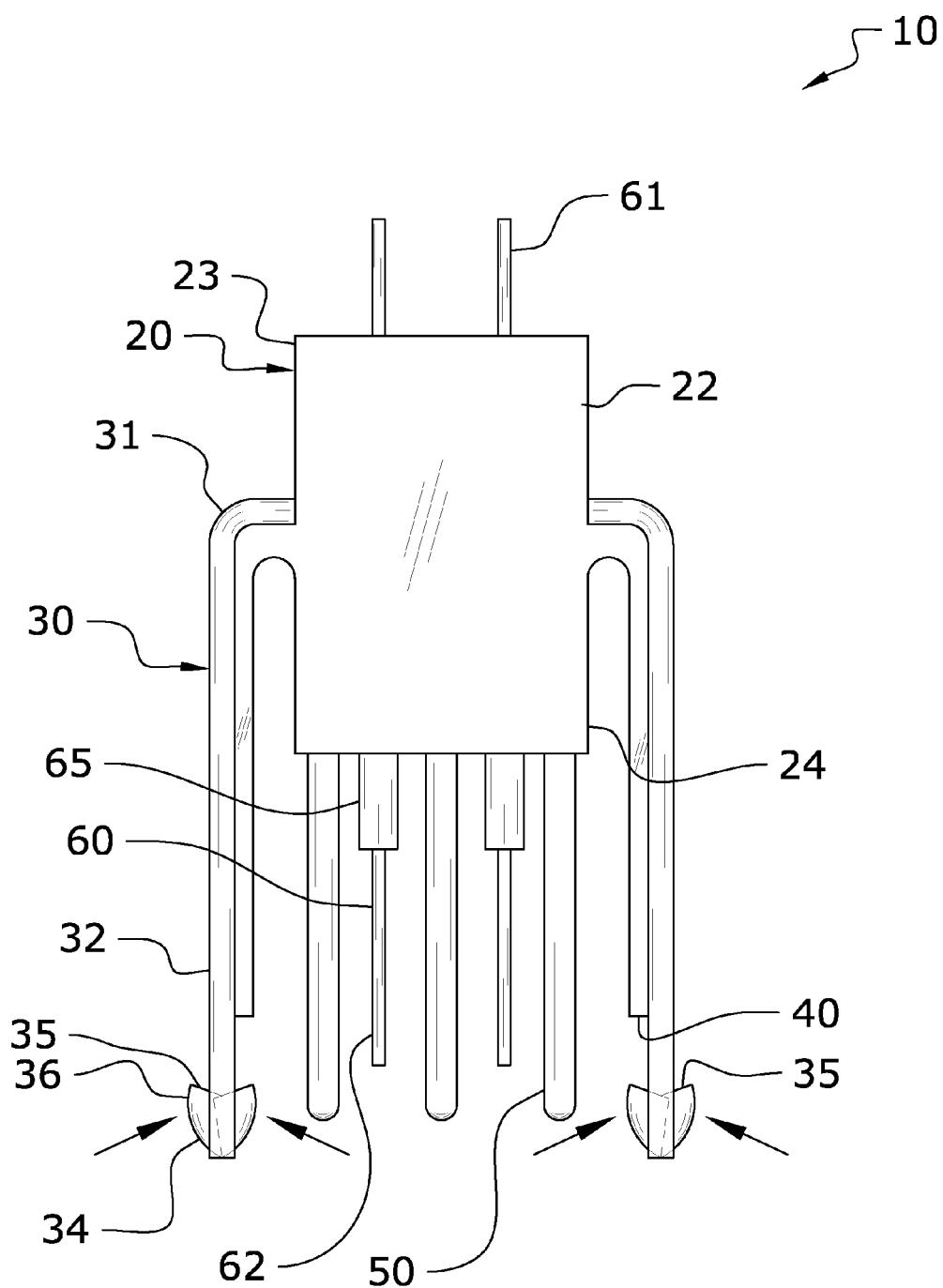
FIG. 11 is a side view illustrating adjustable foot members upon the primary device.

When removing the primary device 20 from the secondary device 12, the elongated portion 32 of the legs 30 or the foot members 34 are depressed inwards so that the foot member 34 is completely aligned with the securing holes 16 as illustrated in FIG. 7. The primary device 20 may then be simply pulled away from the secondary device 12 in a reverse manner of attachment as illustrated in FIGS. 8 and 9. Once the foot members 34 clear the securing holes 16, the legs 30 automatically pivot back to an initial position as illustrated in FIG. 9.

It is appreciated that the primary device 20 may be connected to cables, wires, or other transmission devices, wherein the primary device directly connects to the secondary device 12 without the use of any mating connectors, wherein the legs 30 function to secure the primary device 20 to the secondary device 12 and the contact pins 60 provide the electrical or other connection. The legs 30 and contact pins 60 may be combined or integral in various embodiments of the present invention.

The alternate embodiment, as illustrated in FIGS. 18 through 21 includes a connector device 80 with a body 81, a plurality of alignment members 90, and one or more contact elements 95, wherein the alignment members 90 extend through a plurality of alignment holes 15 of the printed circuit board 12 from the first surface and past the second surface of the circuit board 12 and wherein the contact elements 95 engage one more contact pads 13 on the first surface of the circuit board 12, and a separate retention device 100 having a supporting element 101 and a plurality of fixed sockets 105 is positioned along the second surface of the printed circuit board 12 to receive the alignment members 90 of the connector device 80 therein so that the circuit board 12 is positioned between the body 81 of the connector device 80 and the retention device 100 to temporarily or permanently retain the contact elements 95 of the connector device 80 in contact with the contact pads 13 of the circuit board 12.

The connector device 80 has a body 81, generally of a non conductive, such as plastic, material of various sizes and shapes. The body 81 may be one-piece, such as integrally formed or comprised of multiple sections attached together.

The body 81 may have a cord 85 extending therefrom for leading to a device adapted to be powered or controlled via the printed circuit board 12, wherein the cord 85 has a casing 87 and wires 86 that are generally electrically connected to the printed circuit board 12 via the contact pins 95 of the connector device 80. The wires 86 may be integral with the upper end 96 of the contact pins 95 or may be attached in various manners. It is appreciated that rather than the cord 85, the contact pins 95 may be exposed or various types of plugs or sockets 105 may be located upon the body 81, which are in electrical contact with the contact pins 95 for powering or controlling various types of electronic devices.

The connector device 80 has alignment members 90 and contact pins 95 extending from a lower surface of the body 81. The alignment members 90 are elongated and have an upper end 91 and a lower end 92. The upper end 91 is connected to the body 81 and may be embedded within the body 81 or simply extend from the lower surface. The lower end 92 of the alignment members 90 extends through alignment holes 15 in the printed circuit board 12 to retain the connector device 80 to the printed circuit board 12 via mating with the retention device 100.

The alignment members 90 may or may not be electrically conductive, wherein the contact pins 95, which are separate from the alignment members 90 generally form the electrical connection with the printed circuit board 12. Generally, the connector device 80 includes a plurality of alignment members 90, such as alignment members 90 along the first and second side of the body 81 to comprise a tri-shaped structure; however various other arrangements and number of alignment members 90 may be utilized. The alignment members 90 are also generally longer than the contact pins 95 or at least extend a further distance from the lower surface of the body 81 since the alignment members 90 generally extend through the printed circuit board 12 and the contact pins 95 simply extend to the first surface of the printed circuit board 12 where the contact pads 13 are located and not necessarily through the printed circuit board 12.

The contact pins 95 also generally extend from the lower surface of the body 81. The contact pins 95 may be elongated such as to separate the lower surface of the body 81 from the printed circuit board 12 or may be substantially flat upon the lower surface of the body 81 so that the body 81 is positioned against the first surface of the printed circuit boards 12 substantially against the contact pads 13. It is further appreciated that the contact pads 13 may be flat upon the surface of the printed circuit board 12, slightly raised, or slightly recessed.

The contact pins 95 have an upper end 96 and a lower end 97, wherein the entire contact pin 95 is generally electrically conductive so that the engagement of the lower end 97 of the contact pins 95 with the contact pads 13 of the printed circuit board 12 causes the upper end 96 of the contact pins 95 to receive the electrical signal from the printed circuit board 12. The upper end 96 of the contact pins 95 may extend through the body 81 of the connector device 80 such as to electrically connect with the cord 85 or other device, such as alligator clips, leads, etc. or simply extend to the body 81 to electrically connect with internal circuitry within the body 81 of the connector device 80. The contact pins 95 may be comprised of a solid structure throughout, such as to be linear from the lower end 97 to the upper end 96. The contact pins 95 may be alternately include a spring arrangement as disclosed in other embodiments or have various other structures.

The contact pins 95 are generally arranged between the alignment members 90 as illustrated; however it is appreciated that the contact pins 95 may be arranged in various manners other than those illustrated and various numbers of contact pins 95 may be utilized. Additionally, the contact pins 95 are illustrated as each being separate; it is appreciated that one or more contact pins 95 may be connected in various embodiments.

The retention device 100 is used to temporarily or permanently retain the contact pins 95 against the contact pads 13 by ensuring that the spatial relationship of the connector device 80 remains the same with respect to the printed circuit board 12. The retention device 100 is comprised of a separate structure from the printed circuit board 12 and is preferably not fixedly or temporarily directly connected to the printed circuit board 12 and rather is simply positioned parallel to and next to the lower or second surface of the printed circuit board 12.

The retention device 100 generally comprises a supporting element 101 and a plurality of sockets 105 fixed to the retention device 100. In the prior art, sockets are generally used by themselves to retain connectors to a circuit board; however by individually attaching sockets to pins of the connector a loose connection is generally established that allows the connector to wiggle or move over time thus not forming a secure connection. The supporting element 101 is a crucial feature of the invention to ensure that the sockets 105 are interconnected and thus to substantially eliminate the possibility for individual sockets to wiggle or move thus providing for a more secure connection of the connector device 80.

The supporting element 101 is generally comprised of a thin-plate like structure having a similar surface area as the lower surface of the body 81. An exemplary embodiment of the supporting element 101 is a piece or section of a printed circuit board; however it is appreciated that various types of supporting elements 101 may be utilized.

The sockets 105 generally are extended through openings in the supporting element 101 and secured therein in a fixed manner, such as with an adhesive composition, etc. Each socket 105 has an opening that faces the respective alignment hole 15 of the printed circuit board 12 for receiving the respective alignment member 90. The sockets 105 are also generally elongated to allow for various length alignment members 90. The sockets 105 may include various types of internal retention mechanisms 106 to temporarily or permanently retain the alignment members 90 within the sockets 105. Exemplary sockets and retention mechanisms include those sold by MILL-MAX and more specifically models 0295, 0292, 0294, 0398, 0397, 0297, and 9019/9039. Other types of sockets may be utilized as well.

In use, the sockets 105 are aligned with the alignment holes 15 of the printed circuit board 12 and the alignment members 90 of the connector device 80 are extended through the alignment holes 15 and into the sockets 105 to engage the internal retention mechanisms 106 of the sockets 105. The upper surface of the supporting element 101 is positioned next to the lower surface of the printed circuit board 12 and the lower end 97 of the contact pins 95 are ensured to be engaged with the contact pads 13 of the printed circuit board 12 along the upper surface of the printed circuit board 12 thus retaining the connector device 80 in place.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods and materials are described above. All publications, patent applications, patents, and other references mentioned herein are incorporated by reference in their entirety to the extent allowed by applicable law and regulations. In case of conflict, the present specification, including definitions, will control.

The present invention may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

The invention claimed is:

1. A printed circuit board connector, comprising:
a printed circuit board having a first surface, a second surface, a plurality of alignment holes, and one or more contact pads, wherein said plurality of alignment holes extend through said printed circuit board from said first surface to said second surface, and wherein said one or more contact pads are located along said first surface;
a connector device having a body with an upper surface and a lower surface, a plurality of alignment members, and one or more contact elements, said plurality of alignment members extend from said lower surface of said body and wherein said one or more contact elements extend from said lower surface of said body;
wherein said plurality of alignment members extend through said plurality of alignment holes of said printed circuit board from said first surface and past said second surface of said printed circuit board and wherein said one or more contact elements engage said one more contact pads of said printed circuit board; and
a retention device having a supporting element and a plurality of sockets, wherein said retention device is positioned along said second surface of said printed circuit board;
wherein said plurality of sockets are fixed to said supporting element and wherein said plurality of sockets align with said plurality of alignment holes of said printed circuit board for receiving said plurality of alignment members of said connector device therein so that said printed circuit board is positioned between said body of said connector device and said retention device to temporarily or permanently retain said one or more contact elements of said connector device in contact with said one or more contact pads of said printed circuit board.

2. The printed circuit board connector of claim 1, wherein said one or more contact pads are located between said plurality of alignment holes.

3. The printed circuit board connector of claim 1, wherein said plurality of alignment members are outwardly positioned from said one or more contact elements.

4. The printed circuit board connector of claim 1, wherein said plurality of alignment members are not in electrical communication with said one or more contact pads of said printed circuit board.

5. The printed circuit board connector of claim 1, wherein said one or more contact elements are comprised of one more contact pins.

6. The printed circuit board connector of claim 5, wherein said one or more contact pins extend substantially through said body of said connector device thus being exposed to said upper surface and said lower surface of said body.

7. The printed circuit board connector of claim 6, wherein said connector device has a wired cord extending from said upper surface, said wired cord in electrical communication with said one or more contact pins.

8. The printed circuit board connector of claim 1, wherein said plurality of alignment members are comprised of a greater length than said one or more contact elements.

9. The printed circuit board connector of claim 1, wherein said supporting element is comprised of a thin-plate structure, wherein said plurality of sockets each extend through said supporting element.

10. The printed circuit board connector of claim 9, wherein said supporting element parallels said lower surface of said printed circuit board.

11. The printed circuit board connector of claim 1, wherein said plurality of sockets each include an internal retention mechanism for retaining said plurality of alignment members therein.

12. The printed circuit board connector of claim 1, wherein said retention device is separate from and not directly connected to said printed circuit board.

13. The printed circuit board connector of claim 1, wherein said plurality of alignment members include a first alignment member extending outwardly from a first side of said body along said lower surface and a second alignment member extending outwardly from a second side of said body along said lower surface, wherein said first side is opposite said second side, and wherein said one or more contact elements extend outwardly from said lower surface of said body between said first side and said second side.

14. A printed circuit board connector, comprising:
- a printed circuit board having a first surface, a second surface, a plurality of alignment holes, and one or more contact pads, wherein said plurality of alignment holes extend through said printed circuit board from said first surface to said second surface, and wherein said one or more contact pads are located along said first surface;
- a connector device having a body with an upper surface and a lower surface, a plurality of alignment members, and one or more contact pins, said plurality of alignment members extend from said lower surface of said body and wherein said one or more contact pins extend from said lower surface of said body;
- wherein said plurality of alignment members are not in electrical communication with said one or more contact pads of said printed circuit board;
- wherein said plurality of alignment members extend through said plurality of alignment holes of said printed circuit board from said first surface and past said second surface of said printed circuit board and wherein said one or more contact pins engage said one more contact pads of said printed circuit board; and
- a retention device having a supporting element and a plurality of sockets, wherein said retention device is positioned along said second surface of said printed circuit board;
- wherein said retention device is separate from and not directly connected to said printed circuit board;
- wherein said plurality of sockets are fixed to said supporting element and wherein said plurality of sockets align with said plurality of alignment holes of said printed circuit board for receiving said plurality of alignment members of said connector device therein so that said printed circuit board is positioned between said body of said connector device and said retention device to temporarily or permanently retain said one or more contact pins of said connector device in contact with said one or more contact pads of said printed circuit board.

15. The printed circuit board connector of claim 14, wherein said plurality of alignment members include a first alignment member extending outwardly from a first side of said body along said lower surface and a second alignment member extending outwardly from a second side of said body along said lower surface, wherein said first side is opposite said second side, and wherein said one or more contact pins extend outwardly from said lower surface of said body between said first side and said second side and wherein said one or more contact pads are located between said plurality of alignment holes.

16. The printed circuit board connector of claim 15, wherein said one or more contact pins extend substantially through said body of said connector device thus being exposed to said upper surface and said lower surface of said body.

17. The printed circuit board connector of claim 16, wherein said connector device has a wired cord extending from said upper surface, said wired cored in electrical communication with said one or more contact pins.

18. The printed circuit board connector of claim 14, wherein said plurality of alignment members are comprised of a greater length than said one or more contact pins.

19. The printed circuit board connector of claim 14, wherein said supporting element is comprised of a thin-plate structure, wherein said plurality of sockets each extend through said supporting element, wherein said supporting element parallels said lower surface of said printed circuit board and wherein said plurality of sockets each include an internal retention mechanism for retaining said plurality of alignment members therein.

20. A printed circuit board connector, comprising:
- a printed circuit board having a first surface, a second surface, a plurality of alignment holes, and one or more contact pads, wherein said plurality of alignment holes extend through said printed circuit board from said first surface to said second surface, and wherein said one or more contact pads are located along said first surface;
- a connector device having a body with an upper surface and a lower surface, a plurality of alignment members, and one or more contact pins, said plurality of alignment members extend from said lower surface of said body and wherein said one or more contact pins extend from said lower surface of said body;
- wherein said plurality of alignment members are not in electrical communication with said one or more contact pads of said printed circuit board;
- wherein said plurality of alignment members extend through said plurality of alignment holes of said printed circuit board from said first surface and past said second surface of said printed circuit board and wherein said one or more contact pins engage said one more contact pads of said printed circuit board;
- wherein said plurality of alignment members include a first alignment member extending outwardly from a first side of said body along said lower surface and a second alignment member extending outwardly from a second side of said body along said lower surface, wherein said first side is opposite said second side, and wherein said one or more contact pins extend outwardly from said lower surface of said body between said first side and said second side and
- wherein said one or more contact pads are located between said plurality of alignment holes;
- wherein said one or more contact pins extend substantially through said body of said connector device thus being exposed to said upper surface and said lower surface of said body;
- wherein said connector device has a wired cord extending from said upper surface, said wired cored in electrical communication with said one or more contact pins;

wherein said plurality of alignment members are comprised of a greater length than said one or more contact pins; and a retention device having a supporting element and a plurality of sockets, wherein said retention device is positioned along said second surface of said printed circuit board;

wherein said retention device is separate from and not directly connected to said printed circuit board;

wherein said supporting element is comprised of a thin-plate structure, wherein said plurality of sockets each extend through said supporting element, wherein said supporting element parallels said lower surface of said printed circuit board and wherein said plurality of sockets each include an internal retention mechanism for retaining said plurality of alignment members therein;

wherein said plurality of sockets are fixed to said supporting element and wherein said plurality of sockets align with said plurality of alignment holes of said printed circuit board for receiving said plurality of alignment members of said connector device therein so that said printed circuit board is positioned between said body of said connector device and said retention device to temporarily or permanently retain said one or more contact pins of said connector device in contact with said one or more contact pads of said printed circuit board.

* * * * *